(12) United States Patent
Fang

(10) Patent No.: US 11,139,361 B2
(45) Date of Patent: Oct. 5, 2021

(54) ARRAY SUBSTRATE WITH METAL TRACES, METHOD OF MANUFACTURING SAME, AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Hong Fang, Wuhan (CN)

(*) Notice: Subject to any disclaimer, the term of this patent is extended or adjusted under 35 U.S.C. 154(b) by 369 days.

(21) Appl. No.: 16/333,239

(22) PCT Filed: Dec. 11, 2018

(86) PCT No.: PCT/CN2018/120402
§ 371 (c)(1),
(2) Date: Mar. 14, 2019

(87) PCT Pub. No.: WO2020/082531
PCT Pub. Date: Apr. 30, 2020

(65) Prior Publication Data
US 2021/0126074 A1   Apr. 29, 2021

(30) Foreign Application Priority Data
Oct. 23, 2018   (CN) .......................... 201811238162.3

(51) Int. Cl.
*H01L 29/08*   (2006.01)
*H01L 27/32*   (2006.01)
*H01L 51/56*   (2006.01)

(52) U.S. Cl.
CPC ...... *H01L 27/3276* (2013.01); *H01L 27/3258* (2013.01); *H01L 51/56* (2013.01); *H01L 2227/323* (2013.01); *H01L 2251/5338* (2013.01)

(58) Field of Classification Search
CPC .................. H01L 27/3276; H01L 27/3258
See application file for complete search history.

(56) References Cited

U.S. PATENT DOCUMENTS

| | | | |
|---|---|---|---|
| 8,994,886 B2* | 3/2015 | Sugisaka | G02F 1/136259 349/40 |
| 9,276,055 B1* | 3/2016 | Son | H01L 27/323 |
| 9,287,329 B1* | 3/2016 | Lee | H01L 27/1218 |
| 9,356,087 B1* | 5/2016 | Lee | H01L 27/3209 |
| 10,636,505 B2* | 4/2020 | Dun | G11C 19/287 |
| 10,741,632 B2* | 8/2020 | Lee | H01L 27/3276 |
| 2003/0227579 A1* | 12/2003 | Nakahori | G02F 1/136286 349/43 |

(Continued)

FOREIGN PATENT DOCUMENTS

| CN | 106298803 A | 1/2017 |
|---|---|---|
| CN | 108022942 A | 5/2018 |
| CN | 108231791 A | 6/2018 |

*Primary Examiner* — Caleb E Henry

(57) ABSTRACT

An array substrate, a method of manufacturing the same, and a display panel are provided to raise the wiring space of the metal trace in the longitudinal direction, to extend the length of the metal traces, to prevent the metal traces from being broken during the bending and stretching process, to improve the reliability of the metal traces during the bending and stretching process of the array substrate, and to improve the bending and tensile properties of the array substrate.

8 Claims, 26 Drawing Sheets

(56) References Cited

U.S. PATENT DOCUMENTS

| | | | |
|---|---|---|---|
| 2005/0161670 A1* | 7/2005 | Kimura | G02F 1/136286 257/59 |
| 2009/0091671 A1* | 4/2009 | Tsubata | G02F 1/13458 349/38 |
| 2012/0062447 A1 | 3/2012 | Tseng et al. | |
| 2014/0339549 A1 | 11/2014 | Yamazaki et al. | |
| 2015/0382446 A1* | 12/2015 | Kwon | H01L 27/3276 174/251 |
| 2016/0035759 A1* | 2/2016 | Kwon | H01L 51/0097 257/40 |
| 2016/0035812 A1* | 2/2016 | Kwon | H01L 29/66757 257/40 |
| 2016/0066409 A1* | 3/2016 | Kwon | H01L 23/562 174/254 |
| 2016/0093644 A1* | 3/2016 | Ki | H01L 27/1244 257/40 |
| 2016/0093685 A1* | 3/2016 | Kwon | H01L 51/0097 257/40 |
| 2016/0155788 A1* | 6/2016 | Kwon | H01L 27/3258 257/40 |
| 2016/0172428 A1* | 6/2016 | Song | H01L 27/3276 257/99 |
| 2016/0172623 A1* | 6/2016 | Lee | H01L 51/5253 257/40 |
| 2016/0174304 A1* | 6/2016 | Kim | H01L 51/5253 313/511 |
| 2016/0179229 A1* | 6/2016 | Ahn | G06F 3/04164 345/173 |
| 2016/0181345 A1* | 6/2016 | Lee | H01L 51/0097 257/40 |
| 2016/0181346 A1* | 6/2016 | Kwon | H01L 51/0097 257/40 |
| 2017/0194411 A1* | 7/2017 | Park | H01L 51/5259 |
| 2017/0301266 A1 | 10/2017 | Zhang et al. | |
| 2018/0158417 A1* | 6/2018 | Xiang | G09G 3/3233 |
| 2018/0166018 A1* | 6/2018 | Yang | H01L 27/32 |
| 2018/0188584 A1* | 7/2018 | Yeh | G02F 1/1337 |
| 2019/0214603 A1* | 7/2019 | Quinn | H01L 51/56 |
| 2019/0295475 A1 | 9/2019 | Lee et al. | |
| 2019/0304999 A1* | 10/2019 | Wang | G06F 3/04164 |

\* cited by examiner

ARRAY SUBSTRATE WITH METAL TRACES, METHOD OF MANUFACTURING SAME, AND DISPLAY PANEL

FIELD OF INVENTION

The present disclosure relates to display technologies, and more particularly to an array substrate, a method of manufacturing same, and a display panel.

BACKGROUND OF INVENTION

In display technologies, flat panel display technologies such as liquid crystal displays (LCDs) and organic light emitting diodes (OLEDs) have gradually replaced cathode ray tube (CRT) displays. The OLEDs have self-illumination, a low driving voltage, high luminous efficiency, a short response time, a high definition and contrast, a viewing angle near 180 degrees, a wide temperature range, a flexible display and large-area full-color display, etc. An industry is recognized the OLEDs as one promising display device.

The OLEDs can be classified into passive OLEDs (PMOLEDs) and active OLEDs (AMOLEDs) according to types of driving. The AMOLED includes a low temperature poly-silicon (LTPS) driven backplane and an electroluminescent layer to form a self-illuminating component. Low temperature polysilicon has a high electron mobility. For the AMOLED, low temperature polysilicon material has advantages of a high resolution, a fast reaction speed, a high brightness, a high aperture ratio, and low energy consumption.

At present, a mainstream of small-size mobile phone displays on the market is double-side displays. As people's demand for diversified forms of thinning mobile phones is increasing, a foldable mobile phone will be a new direction for the development of a display industry and a breakthrough point of production capacity. Compared to backplane technologies we use today, the technical requirements of the foldable mobile phone and the reliability requirements for the product will be higher.

The technical problem in the prior art is that the direct transfer of LTPS backplane technologies to a foldable product can cause fragility of the backplane and breakage of traces. Electrical leakage may occur during a bending process, and a reliability of the product is low.

SUMMARY OF INVENTION

In view of the above, the present disclosure provides an array substrate, a method of manufacturing same, and a display panel to prevented a metal trace from being broken during a bending and stretching process, and to improve a reliability of the metal trace during the bending and stretching process of the array substrate and bending and tensile properties of the array substrate.

In order to achieve above-mentioned object of the present disclosure, one embodiment of the disclosure provides an array substrate including at least one first metal trace and at least one second metal trace disposed on the at least one first metal trace. The at least one first metal trace is electrically insulated from the at least one second metal trace. The at least one first metal trace includes a plurality of first recesses and a plurality of first protrusions arranged alternately. The at least one second metal trace includes a plurality of second recesses and a plurality of second protrusions arranged alternately.

In one embodiment of the disclosure, an orthogonal projection of the at least one first metal trace on a plane parallel to the array substrate intersects an orthogonal projection of the at least one second metal trace on the plane parallel to the array substrate.

In one embodiment of the disclosure, the array substrate further includes at least one third metal trace disposed on the at least one first metal trace and under the at least one second metal trace. The at least one third metal trace is electrically insulated from the at least one first metal trace and the at least one second metal trace. The at least one third metal trace includes a plurality of third recesses and a plurality of third protrusions arranged alternately. An orthogonal projection of the at least one third metal trace on the plane parallel to the array substrate coincides with the orthogonal projection of the at least one first metal trace on the plane parallel to the array substrate. An orthogonal projection of the third recesses on the plane parallel to the array substrate coincides with an orthogonal projection of the first recesses on the plane parallel to the array substrate. An orthogonal projection of the third protrusions on the plane parallel to the array substrate coincides with an orthogonal projection of the first protrusions on the plane parallel to the array substrate.

In one embodiment of the disclosure, the at least one first metal trace is a first gate scan line, the at least one second metal trace is a data line, and the at least one third metal trace is a second gate scan line.

In one embodiment of the disclosure, an orthogonal projection of the at least one first metal trace on a plane parallel to the array substrate coincides with an orthogonal projection of the at least one second metal trace on the plane parallel to the array substrate. An orthogonal projection of the first recesses on the plane parallel to the array substrate coincides with an orthogonal projection of the second recesses on the plane parallel to the array substrate. An orthogonal projection of the first protrusions on the plane parallel to the array substrate coincides with an orthogonal projection of the second protrusions on the plane parallel to the array substrate.

In one embodiment of the disclosure, the at least one first metal trace is a first gate scan line, and the at least one second metal trace is a second gate scan line.

In one embodiment of the disclosure, the first recesses and the first protrusions are arranged alternately along a longitudinal direction of the at least one first metal trace. The second recesses and the second protrusions are arranged alternately along a longitudinal direction of the at least one second metal trace.

In one embodiment of the disclosure, the at least one first metal trace is a composite layer including of Ti/Cu/Ti and Cu. The at least one second metal trace is a composite layer including of Ti/Cu/Ti and Cu.

In one embodiment of the disclosure, the array substrate further includes a substrate, an active layer disposed on the substrate, a first electrical insulating layer covering the active layer and an organic light emitting layer. The at least one first metal trace is disposed on the first electrical insulating layer. The array substrate further includes a second electrical insulating layer between the at least one first metal trace and the at least one second metal trace. The organic light emitting layer is disposed on the at least one second metal trace and electrically connected to the at least one second metal trace.

Furthermore, another embodiment of the disclosure provides a method of manufacturing the array substrate including steps of: providing a substrate, providing an active layer disposed on a surface of the substrate, providing a first electrical insulating layer covering a surface of the active layer and the surface of the substrate, forming the at least one first metal trace on the first electrical insulating layer, forming a second electrical insulating layer on the at least one first metal trace, and forming the at least one second metal trace on the second electrical insulating layer. The first electrical insulating layer includes a plurality of first parts with a first thickness and a plurality of second parts with a second thickness. The first thickness of the first parts of the first electrical insulating layer is less than the second thickness of the second parts of the first electrical insulating layer. The first parts and the second parts of the first electrical insulating layer are arranged alternately. In the step of forming the at least one first metal trace on the first electrical insulating layer, the at least one first metal trace forms the first recesses at the first part of the first electrical insulating layer. The at least one first metal trace forms the first protrusions at the second part of the first electrical insulating layer. In the step of forming a second electrical insulating layer on the at least one first metal trace, the second electrical insulating layer includes a plurality of first parts with a first thickness and a plurality of second parts with a second thickness. The first thickness of the first parts of the second electrical insulating layer is less than the second thickness of the second parts of the second electrical insulating layer. The first parts and the second parts of the second electrical insulating layer are arranged alternately. In the step of forming the at least one second metal trace on the second electrical insulating layer, the at least one second metal trace forms the second recesses at the first part of the second electrical insulating layer. The at least one second metal trace forms the second protrusions at the second part of the second electrical insulating layer.

In one embodiment of the disclosure, an orthogonal projection of the first part of the second electrical insulating layer on a plane parallel to the substrate is staggered from an orthogonal projection of the first recesses of the at least one first metal trace on the plane parallel to the substrate.

In one embodiment of the disclosure, an orthogonal projection of the first part of the second electrical insulating layer on a plane parallel to the substrate coincides with an orthogonal projection of the first recesses of the at least one first metal trace on the plane parallel to the substrate.

In one embodiment of the disclosure, after the step of forming the second metal trace on the second electrical insulating layer, the method further includes forming a third electrical insulating layer disposed on the at least one second metal trace, and forming at least one third metal trace on the third electrical insulating layer. In the step of forming a third electrical insulating layer disposed on the at least one second metal trace, the third electrical insulating layer includes a plurality of first parts with a first thickness and a plurality of second parts with a second thickness. The first thickness of the first parts of the third electrical insulating layer is less than the second thickness of the second parts of the third electrical insulating layer. The first parts and the second parts of the third electrical insulating layer are arranged alternately. An orthogonal projection of the first part of the third electrical insulating layer on the plane parallel to the substrate is staggered from an orthogonal projection of the first recesses of the at least one second metal trace on the plane parallel to the substrate. In the step of forming at least one third metal trace on the third electrical insulating layer, the at least one third metal trace forms a third recess at the first part of the third electrical insulating layer. The at least one third metal trace forms a third protrusion at the second part of the third electrical insulating layer.

In one embodiment of the disclosure, the method further includes steps of providing a flatten layer covering the at least one second metal trace, and forming an organic light emitting layer on the flatten layer. An anode of the organic light emitting layer is electrically connected to a drain electrode of the at least one second metal trace.

Furthermore, another embodiment of the disclosure provides a display panel including an array substrate and a cover plate disposed on the array substrate. The array substrate includes at least one first metal trace and at least one second metal trace disposed on the at least one first metal trace. The at least one first metal trace is electrically insulated from the at least one second metal trace. The at least one first metal trace includes a plurality of first recesses and a plurality of first protrusions arranged alternately. The at least one second metal trace includes a plurality of second recesses and a plurality of second protrusions arranged alternately.

In comparison with the prior art, the array substrate, the method of manufacturing the same, and the display panel of the embodiments of the disclosure raise the wiring space of the metal trace in the longitudinal direction, extend the length of the metal traces, prevent the metal traces from being broken during the bending and stretching process, improve the reliability of the metal traces during the bending and stretching process of the array substrate, and improve the bending and tensile properties of the array substrate.

DETAILED DESCRIPTION OF PREFERRED EMBODIMENTS

The following description of the embodiments is provided by reference to the following drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

Figure 1:
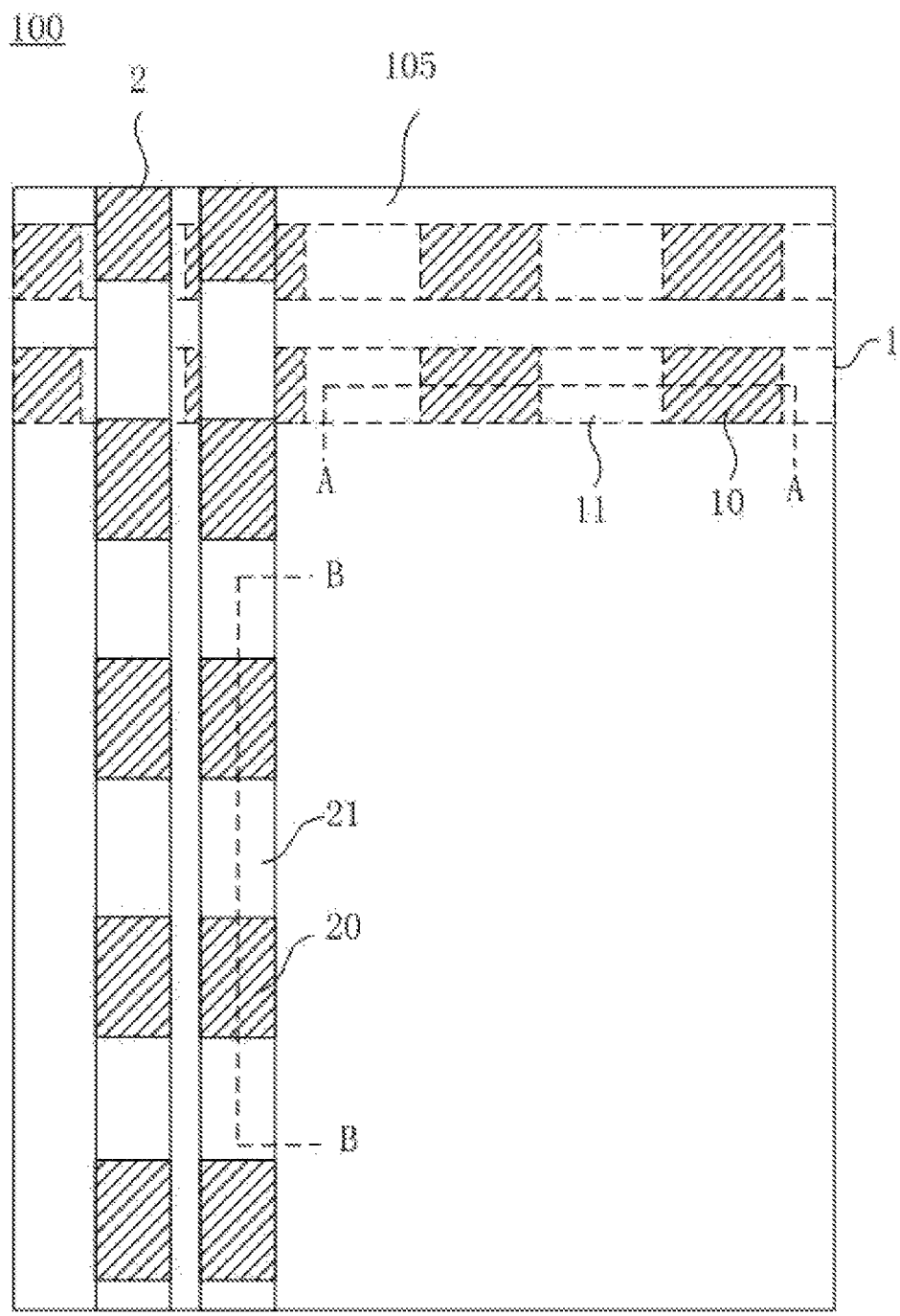
FIG. 1 is a schematic top view of an array substrate according to a first embodiment of the disclosure.
Figure 2:
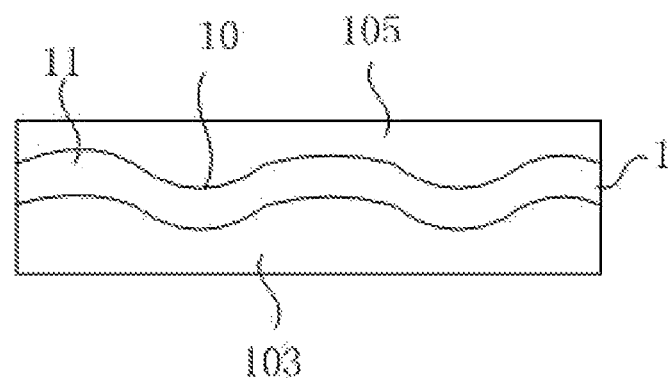
FIG. 2 is a schematic cross section view along AA line of FIG. 1.
Figure 3:
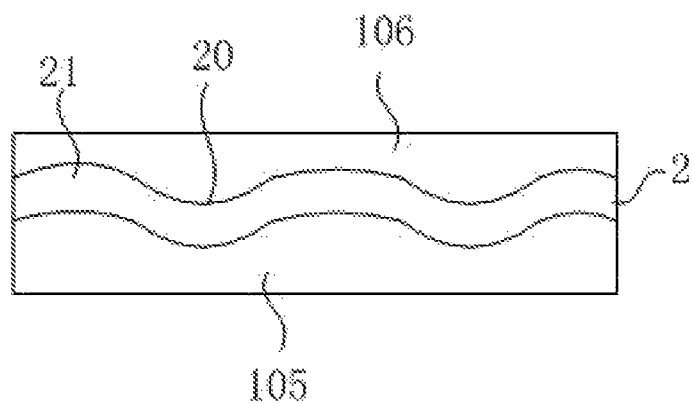
FIG. 3 is a schematic cross section view along BB line of FIG. 1.

FIG. 1 is a schematic top view of an array substrate according to a first embodiment of the disclosure. FIG. 2 is a schematic cross section view along AA line of FIG. 1. FIG. 3 is a schematic cross section view along BB line of FIG. 1. Referring to FIGS. 1, 2, and 3, one embodiment of the disclosure provides an array substrate 100 including at least one first metal trace 1 and at least one second metal trace 2 disposed on the at least one first metal trace 1. In order to clearly illustrate the technical solution of an embodiment of the present disclosure, two first metal traces 1 and two second metal traces 2 are schematically illustrated in the drawings. The disclosure is not limited thereto. In other embodiments, the numbers of the first metal trace 1 and the second metal trace 2 can be set according to actual needs.

The aforementioned "on" refers not to the vertical upper side, but to the positional relationship of the layers in which the two are positioned. In details, the second metal trace 2 positioned on the first metal trace 1 means that the layer where the second metal trace 2 is positioned is above the layer where the first metal trace 1 is positioned. The relationship between the first metal trace 1 and the second metal trace 2 includes, but is not limited to, an orthogonal projection of the first metal trace 1 intersecting an orthogonal projection of the second metal trace 2, or the orthogonal projection of the first metal trace 1 coinciding with the orthogonal projection of the second metal trace 2. In this embodiment, in the direction perpendicular to the array substrate 100, that is, in the top view direction of the array substrate 100, the orthogonal projection of the first metal trace 1 intersects the second metal trace 2. For the corresponding relationship, refer to the top view of the array substrate 100 illustrated in FIG. 1. The first metal trace 1 is a first gate scan line, which is electrically connected to the gate electrode 107 of the thin film transistor of the array substrate 100 (see FIG. 4). The second metal trace 2 is a data line which is electrically connected to the source electrode 108 of the thin film transistor of the array substrate 100 (see FIG. 4).

The at least one first metal trace 1 is electrically insulated from the at least one second metal trace 2. In this embodiment, a second electrical insulating layer 105 is disposed at a position where the first metal trace 1 intersects the second metal trace 2 and a periphery thereof. So that the first metal trace 1 and the second metal traces 2 are electrically insulated from each other. Because the first metal trace 1 is blocked by the second insulating layer 105 in the view angle of FIG. 1, the first metal trace 1 is illustrated by a dotted line.

Referring to FIGS. 1 and 2, the at least one first metal trace 1 includes a plurality of first recesses 10 and a plurality of first protrusions 11 arranged alternately. The first metal trace 1 is formed into a structure having a concavo-convex shape. The advantage is that the wiring space of the first metal trace 1 is raised in the longitudinal direction, and the length of the first metal trace 1 is extended. The first metal trace 1 is prevented from being broken during the bending process. The reliability of the first metal trace 1 during the bending and stretching process of the array substrate 100 is improved, and the bending and tensile properties of the array substrate 100 are improved. In the embodiment, the first recesses 10 and the first protrusions 11 are alternately arranged along the longitudinal direction of the first metal trace 1. The first recesses 10 is schematically depicted by hatching to distinguish it from the first protrusions 11 in FIG. 1.

Referring to FIGS. 1 and 2, the at least one second metal trace 2 includes a plurality of second recesses 20 and a plurality of second protrusions 21 arranged alternately. The second metal trace 2 is formed into a structure having a concavo-convex shape. The advantage is that the wiring space of the second metal trace 2 is raised in the longitudinal direction, and the length of the second metal trace 2 is extended. The second metal trace 2 is prevented from being broken during the bending process. The reliability of the second metal trace 2 during the bending and stretching process of the array substrate 100 is improved, and the bending and tensile properties of the array substrate 100 are improved. In the embodiment, the second recesses 20 and the second protrusions 21 are alternately arranged along the longitudinal direction of the second metal trace 2. The second recesses 20 is schematically depicted by hatching to distinguish it from the second protrusions 21 in FIG. 1.

In one embodiment of the disclosure, the at least one first metal trace 1 and the at least one second metal trace 2 may be made of a metal or a composite metal having a good ductility, for example, a composite layer of Ti/Cu/Ti and Cu, to improve the bending ability of the first metal trace 1 and the second metal trace 2. That provides bending properties of the array substrate 100.

Figure 4:
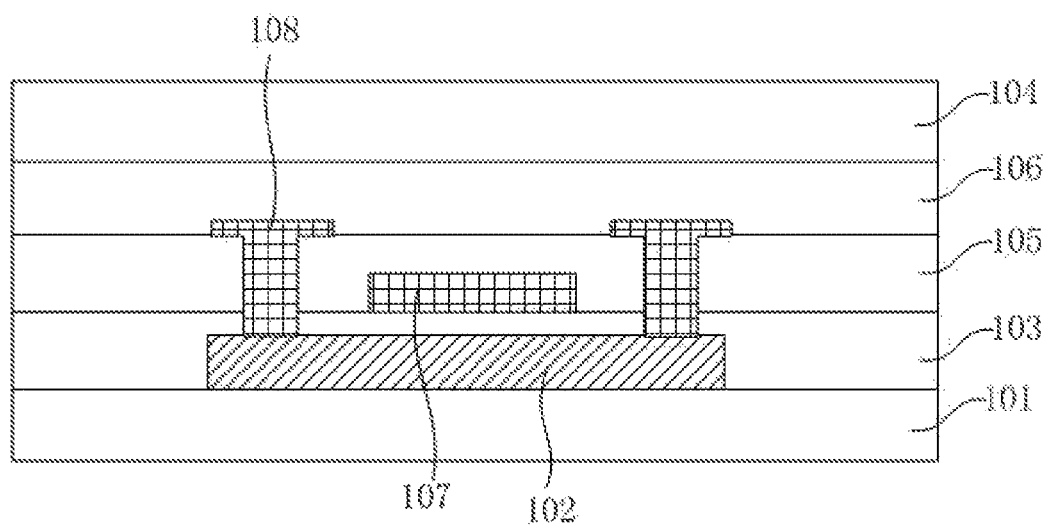
FIG. 4 is a schematic cross section view of an array substrate according to the first embodiment of the disclosure.

FIG. 4 is a schematic cross section view of an array substrate according to the first embodiment of the disclosure. Referring to FIGS. 1, 2, 3 and 4, in one embodiment of the disclosure, the array substrate 100 further includes a substrate 101, an active layer 102 disposed on the substrate 101, a first electrical insulating layer 103 covering the active layer 102, and an organic light emitting layer 104. In order to clearly illustrate the structure of the array substrate 100 of the disclosure, only the related structures are schematically illustrated in FIGS. 1, 2, and 3. The at least one first metal trace 1 is connected to the gate electrode 107 and is disposed on the first electrical insulating layer 103. The array substrate 100 further includes a second electrical insulating layer 105 disposed on the at least one first metal trace 1. The at least one second metal trace 2 is connected to the source electrode 108 and is disposed on the second electrical insulating layer 105. The at least one first metal trace 1 is electrically insulated from the at least one second metal trace 2. The organic light emitting layer 104 is disposed on the at least one second metal trace 2 and electrically connected to the at least one second metal trace 2. The array substrate 100 further includes a flatten layer 106 disposed between the organic light emitting layer 104 and the at least one second metal trace 2. The organic light-emitting layer 104 may be a conventional structure in the art, and includes a conventional structure such as an anode, an organic layer, and a cathode layer. The details of the organic light-emitting layer 104 are not described herein again.

Figure 5A:
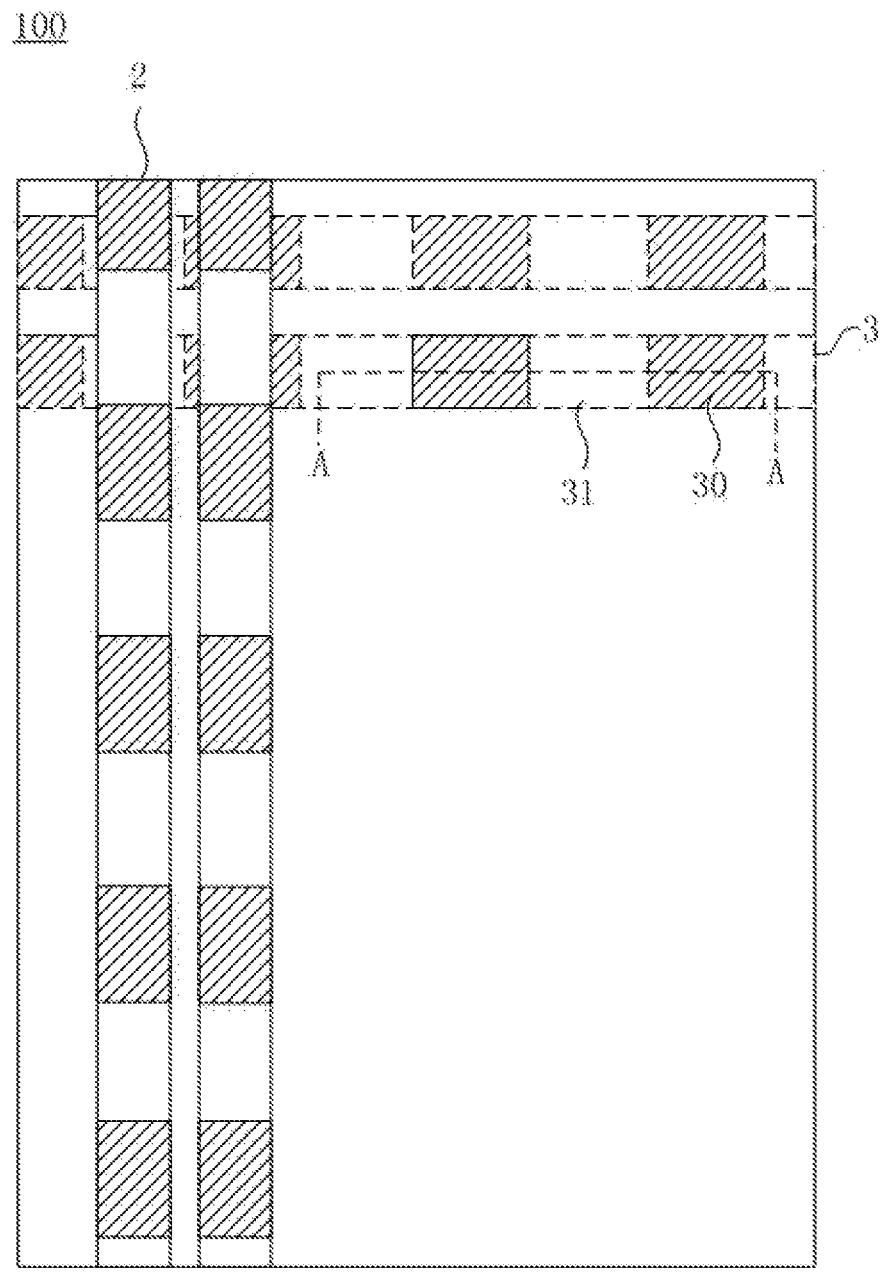
FIG. 5A is a schematic top view of an array substrate according to a second embodiment of the disclosure.
Figure 5B:
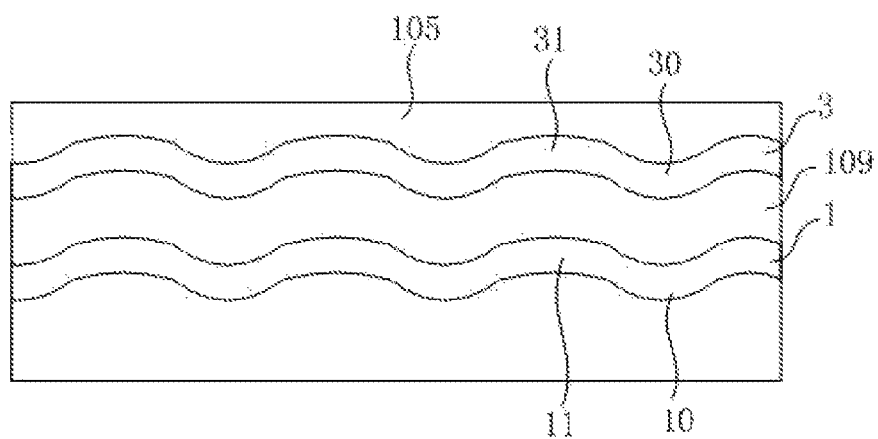
FIG. 5B is a schematic cross section view along AA line of FIG. 5A.

FIG. 5A is a schematic top view of an array substrate according to a second embodiment of the disclosure. FIG. 5B is a schematic cross section view along AA line of FIG. 5A. Referring to FIGS. 5A, and 5B, in the second embodiment of the disclosure, the difference of the array substrate between the first embodiment and the second embodiment is that the array substrate 100 in the second embodiment further includes at least one third metal trace 3. Two third metal traces 3 are schematically illustrated in the drawings. The disclosure is not limited thereto. In other embodiments, the numbers of the third metal traces 3 may be set according to actual needs.

The at least one third metal trace 3 is disposed on the at least one first metal trace and under the at least one second metal trace. The aforementioned "on" refers not to the vertical upper side, but to the positional relationship of the layers in which the two are positioned. In details, the third metal trace 3 positioned on the first metal trace 1 means that the layer where the third metal trace 3 is positioned is above the layer where the first metal trace 1 is positioned. The aforementioned "under" refers not to the vertical lower side, but to the positional relationship of the layers in which the two are positioned. In details, the third metal trace 3 positioned under the second metal trace 2 means that the layer where the third metal trace 3 is positioned is under the layer where the second metal trace 2 is positioned.

An orthogonal projection of the at least one third metal trace 3 on the plane parallel to the array substrate 100 coincides with the orthogonal projection of the at least one first metal trace 1 on the plane parallel to the array substrate 100. An orthogonal projection of the at least one first metal trace 1 on the plane parallel to the array substrate 100 intersects with the orthogonal projection of the at least one second metal trace 2 on the plane parallel to the array substrate 100. For the corresponding relationship, refer to the array substrate 100 illustrated in FIG. 5A. Because the orthogonal projection of the at least one third metal trace 3 coincides with the orthogonal projection of the at least one first metal trace 1, the at least one first metal trace 1 is blocked by the at least one third metal trace 3. the at least one first metal trace 1 is not illustrated in FIG. 5.

The at least one third metal trace 3 is electrically insulated from the at least one first metal trace 1 and the at least one second metal trace 2. In this embodiment, a gate electrical insulating layer 109 is disposed at a position where the first metal trace 1 intersects the third metal trace 3 and a periphery thereof. So that the first metal trace 1 and the third metal traces 3 are electrically insulated from each other. A second electrical insulating layer 105 is disposed at a position where the second metal trace 2 intersects the third metal trace 3 and a periphery thereof. So that the second metal trace 2 and the third metal traces 3 are electrically insulated from each other.

The at least one third metal trace 3 includes a plurality of third recesses 30 and a plurality of third protrusions 31 arranged alternately. An orthogonal projection of the third recesses 30 on the plane parallel to the array substrate 100 coincides with an orthogonal projection of the first recesses 10 on the plane parallel to the array substrate 100. An orthogonal projection of the third protrusions 31 on the plane parallel to the array substrate 100 coincides with an orthogonal projection of the first protrusions 11 on the plane parallel to the array substrate 100. In the embodiment, the third recesses 30 and the third protrusions 31 are alternately arranged along the longitudinal direction of the third metal trace 3. The third recesses 30 is schematically depicted by hatching to distinguish it from the third protrusions 31 in FIG. 5A.

In one embodiment of the disclosure, the at least one first metal trace 1 is a first gate scan line, the at least one second metal trace 2 is a data line, and the at least one third metal trace 3 is a second gate scan line. The at least one first metal trace 1 is electrically connected to a first gate of the thin film transistor of the array substrate. The at least one second metal trace 2 is electrically connected to the data line of the thin film transistor of the array substrate. The at least one third metal trace 3 is electrically connected to a second gate of the thin film transistor of the array substrate. Referring to FIG. 5B, a storage capacitor is formed between the first metal trace 1 and the third metal trace 3. Because the orthogonal projection of the first recess 10 coincides with the orthogonal projection of the third recess 30, and the orthogonal projection of the first protrusion 11 coincides with the orthogonal projection of the third protrusion 31, the facing area of the storage capacitor increases. This increases the capacity of the storage capacitor and increases the capacity of the storage capacitor to store charge. The leakage issue occurring in the array substrate 100 during the bending and stretching process is improved, and the uniformity of the display brightness is ensured.

Figure 6A:
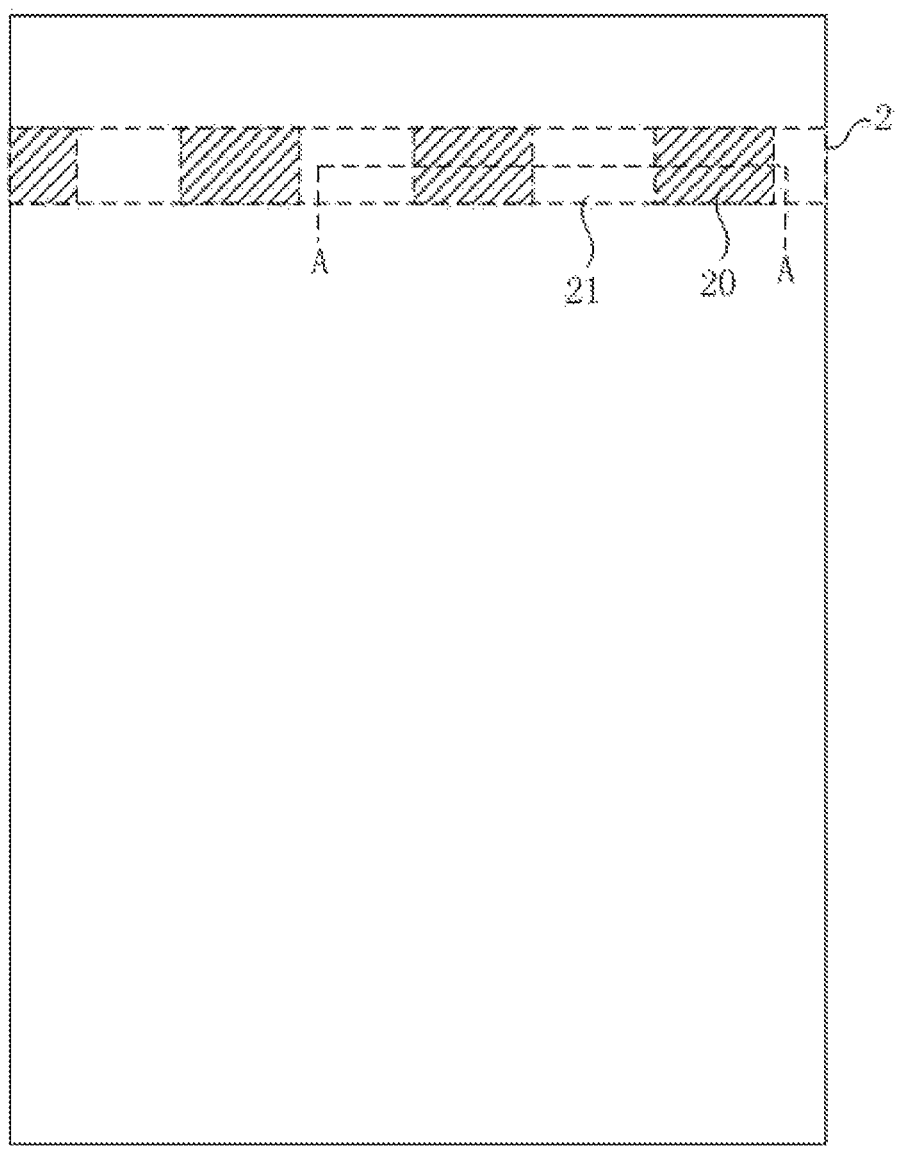
FIG. 6A is a schematic top view of an array substrate according to a third embodiment of the disclosure.
Figure 6B:
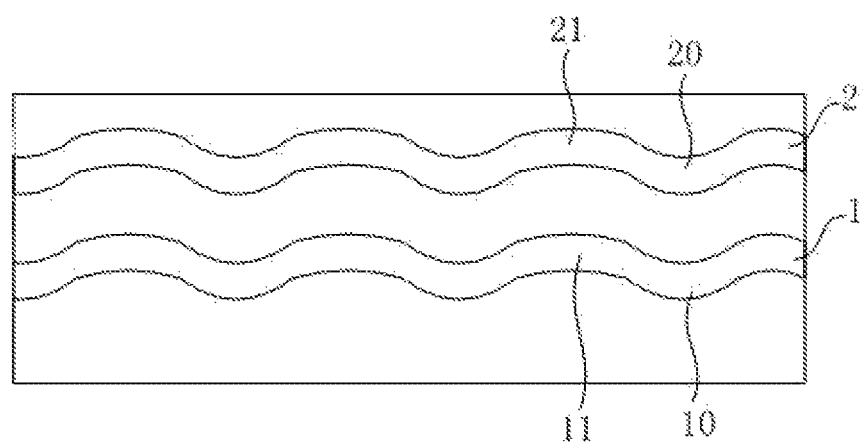
FIG. 6B is a schematic cross section view along AA line of FIG. 6A.

Furthermore, the disclosure provides a third embodiment. FIG. 6A is a schematic top view of an array substrate according to the third embodiment of the disclosure. FIG. 6B is a schematic cross section view along AA line of FIG. 6A. In the first embodiment, the at least one first metal trace 1 is the first gate scan line, and the at least one second metal trace 2 is the data line. However, in the third embodiment, the at least one first metal trace 1 is the first gate scan line, and the at least one second metal trace 2 is the second gate scan line. Referring to FIGS. 6A and 6B, an orthogonal projection of the at least one first metal trace 1 on the plane parallel to the array substrate 100 coincides with the orthogonal projection of the at least one second metal trace 2 on the plane parallel to the array substrate 100. An orthogonal projection of the first recesses 10 on the plane parallel to the array substrate 100 coincides with an orthogonal projection of the second recesses 20 on the plane parallel to the array substrate 100. An orthogonal projection of the first protrusions 11 on the plane parallel to the array substrate 100 coincides with an orthogonal projection of the second protrusions 21 on the plane parallel to the array substrate 100.

A storage capacitor is formed between the first metal trace 1 and the second metal trace 2. Because the orthogonal projection of the first recess 10 coincides with the orthogonal projection of the second recess 20, and the orthogonal projection of the first protrusion 11 coincides with the orthogonal projection of the second protrusion 21, the facing area of the storage capacitor increases. This increases the capacity of the storage capacitor and increases the capacity of the storage capacitor to store charge. The leakage issue occurring in the array substrate 100 during the bending and stretching process is improved, and the uniformity of the display brightness is ensured. In this embodiment, the wiring space of the first metal trace 1 is raised in the longitudinal direction, and the length of the first metal trace 1 is extended. The first metal trace 1 is prevented from being broken during the bending process. The reliability of the first metal trace 1 during the bending and stretching process of the array substrate 100 is improved, and the bending and tensile properties of the array substrate 100 are improved.

Furthermore, another embodiment of the disclosure provides a method of manufacturing the array substrate. FIGS. 7A to 7L are schematic views of a method of manufacturing an array substrate according to the first embodiment of the disclosure.

Figure 7A:
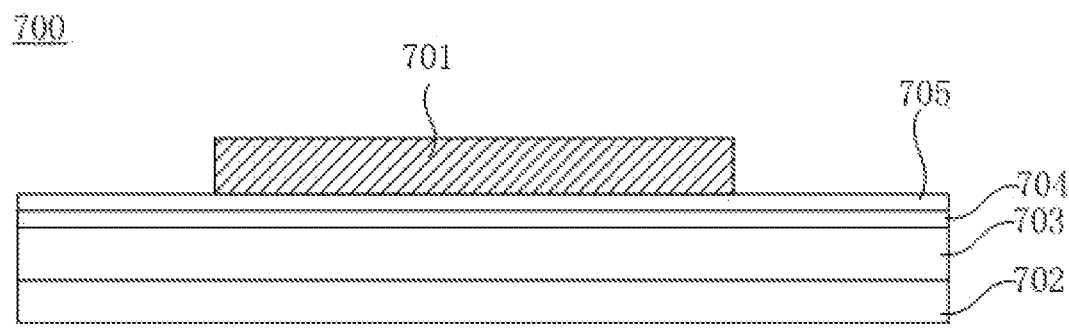
FIG. 7A is a schematic view of a method of manufacturing an array substrate according to the first embodiment of the disclosure.
Figure 7B:
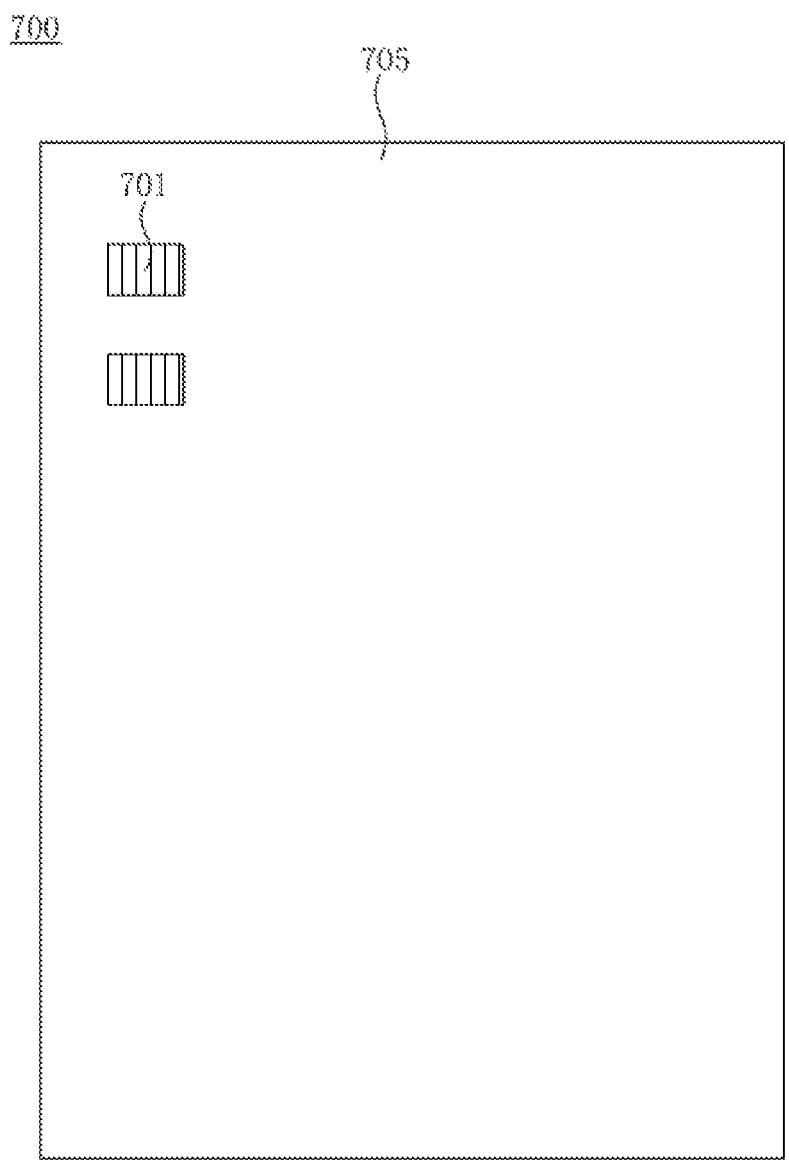
FIG. 7B is a schematic view of a method of manufacturing an array substrate according to the first embodiment of the disclosure.

Referring to FIGS. 7A and 7B, FIG. 7A is a cross section view, and FIG. 7B is a top view. The method of manufacturing the array substrate includes steps of providing a substrate 700, and providing an active layer 701 disposed on a surface of the substrate 700. In details, the substrate 700 further includes a substrate 702, a flexible film layer 703 disposed on the substrate 702, an isolation layer 704 disposed on the flexible film layer 703, and a buffer layer 705. The active layer 701 is disposed on the buffer layer 705. The active layer 701, substrate 702, flexible film layer 703, isolation layer 704, and buffer layer 705 are conventional structures of flexible display panel in the art. For example, in the embodiment, the substrate 702 is a glass substrate. A PI layer is deposited on the glass substrate as a flexible film layer 703. An isolation layer (barrier) 704 is deposited on the flexible film layer 703. The isolation layer 704 is SiNx/SiOx. A buffer layer 705 is deposited on the isolation layer 704. The buffer layer 705 includes, but is not limited to, SiNx/SiOx, and a polysilicon is formed on the buffer layer 705 as an active layer 701.

Figure 7C:
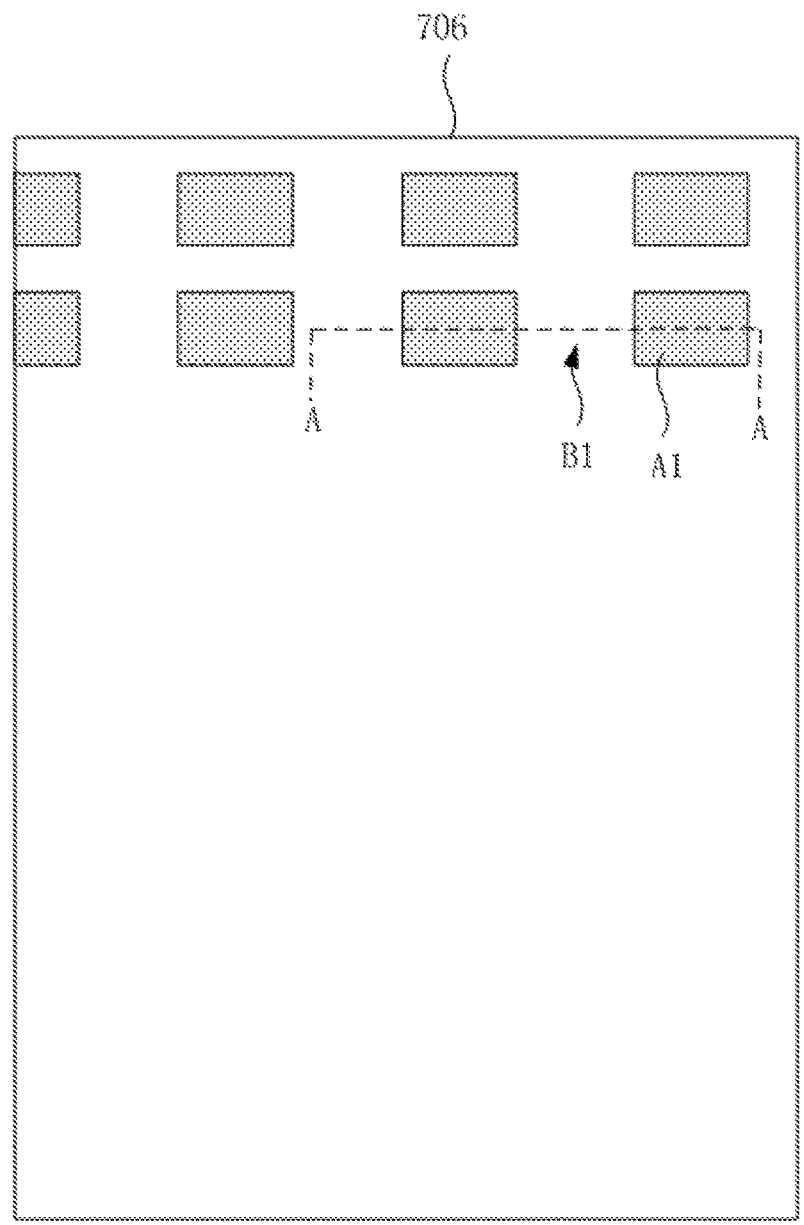
FIG. 7C is a schematic view of a method of manufacturing an array substrate according to the first embodiment of the disclosure.
Figure 7D:
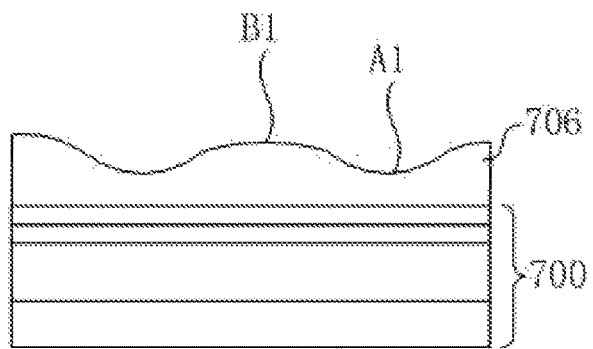
FIG. 7D is a schematic view of a method of manufacturing an array substrate according to the first embodiment of the disclosure.

Referring to FIGS. 7C and 7D, FIG. 7C is a top view, and FIG. 7D is a cross section view along AA line of FIG. 7C. The method of manufacturing the array substrate further includes steps of providing a first electrical insulating layer 706 covering a surface of the active layer 701 and the surface of the substrate 700. The first electrical insulating layer 706 includes a plurality of first parts A1 with a first thickness and a plurality of second parts B1 with a second thickness. The first thickness of the first parts A1 of the first electrical insulating layer 706 is less than the second thickness of the second parts B1 of the first electrical insulating layer 706. The first parts A1 of the first electrical insulating layer 706 and the second parts B1 of the first electrical insulating layer 706 are arranged alternately. In order to clearly describe the technical solution of the present disclosure, in FIG. 7C, only a part of the first parts A1 and the second parts B1 are schematically illustrated. The method of forming the first electrical insulating layer 706 having different thicknesses includes, but is not limited to, mask etching or the like. For example, in an embodiment, a method of forming the first insulating layer 706 having different thicknesses is covering with an insulating layer on a surface of the active layer 701 and the surface of the substrate 700, and removing a portion of the first electrical insulating layer 706 by an etching solution to form a plurality of first regions A1 having a first thickness and a plurality of second regions B1 having a second thickness. The etching solution includes, but is not limited to, an HF solution.

Figure 7E:
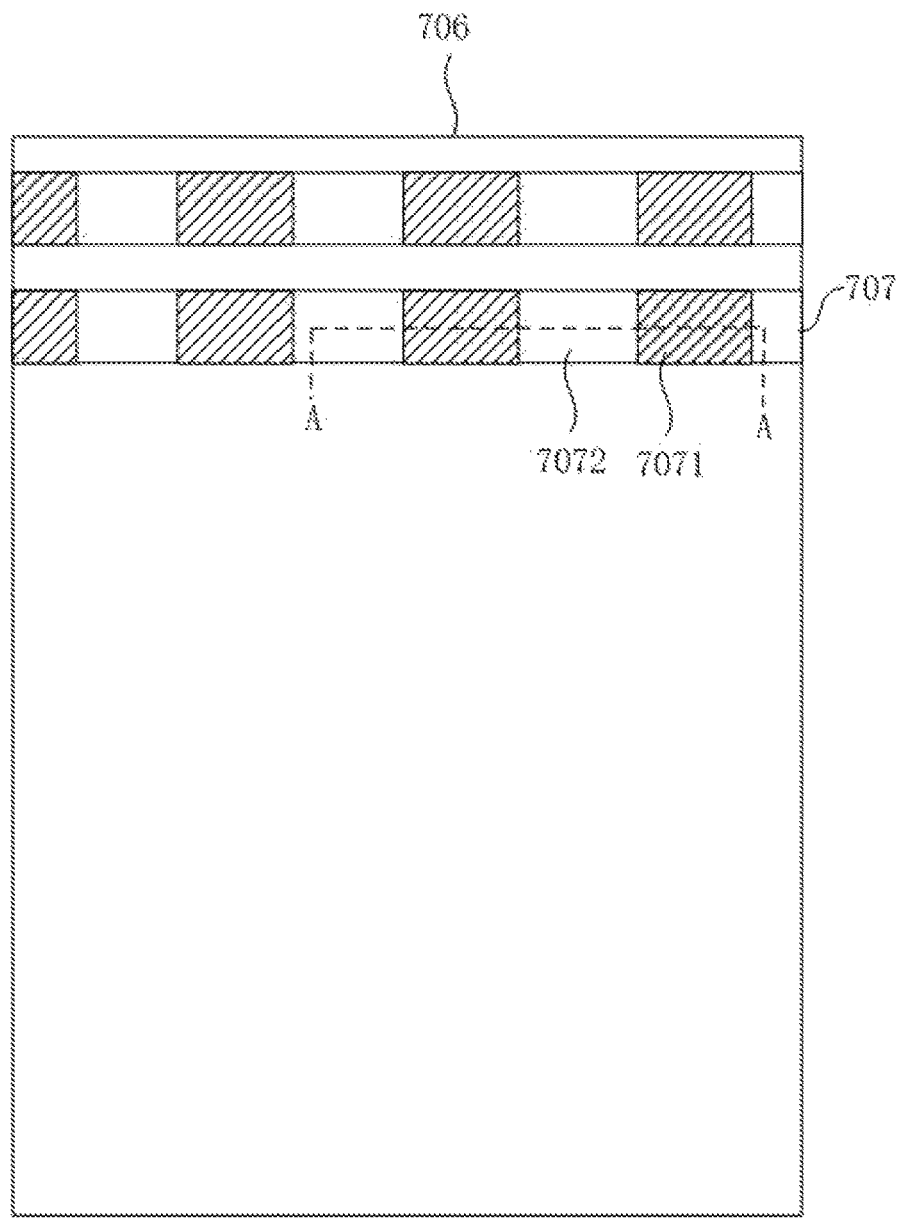
FIG. 7E is a schematic view of a method of manufacturing an array substrate according to the first embodiment of the disclosure.
Figure 7F:
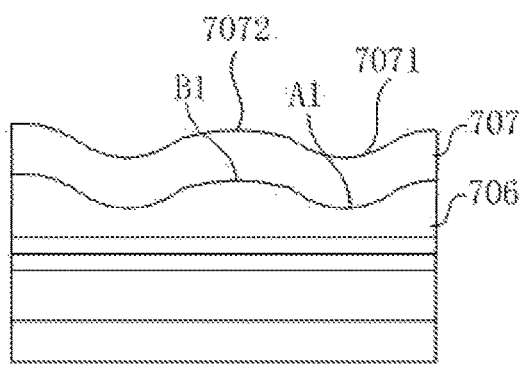
FIG. 7F is a schematic view of a method of manufacturing an array substrate according to the first embodiment of the disclosure.

Referring to FIGS. 7E and 7F, FIG. 7E is a top view, and FIG. 7F is a cross section view along AA line of FIG. 7E. The method of manufacturing the array substrate further includes steps of forming the at least one first metal trace 707 on the first electrical insulating layer 706, The at least one first metal trace 707 forms the first recesses 7071 at the first part A1 of the first electrical insulating layer 706. The at least one first metal trace 707 forms the first protrusions 7072 at the second part B1 of the first electrical insulating layer 706. The first metal trace 707 is formed into a structure having a concavo-convex shape. The method of forming the first metal trace 707 may be to deposit a metal layer on the first electrical insulating layer 706, and pattern the metal layer to form the first metal trace 707. The detail of the method is prior art and will not be described the again.

Figure 7G:
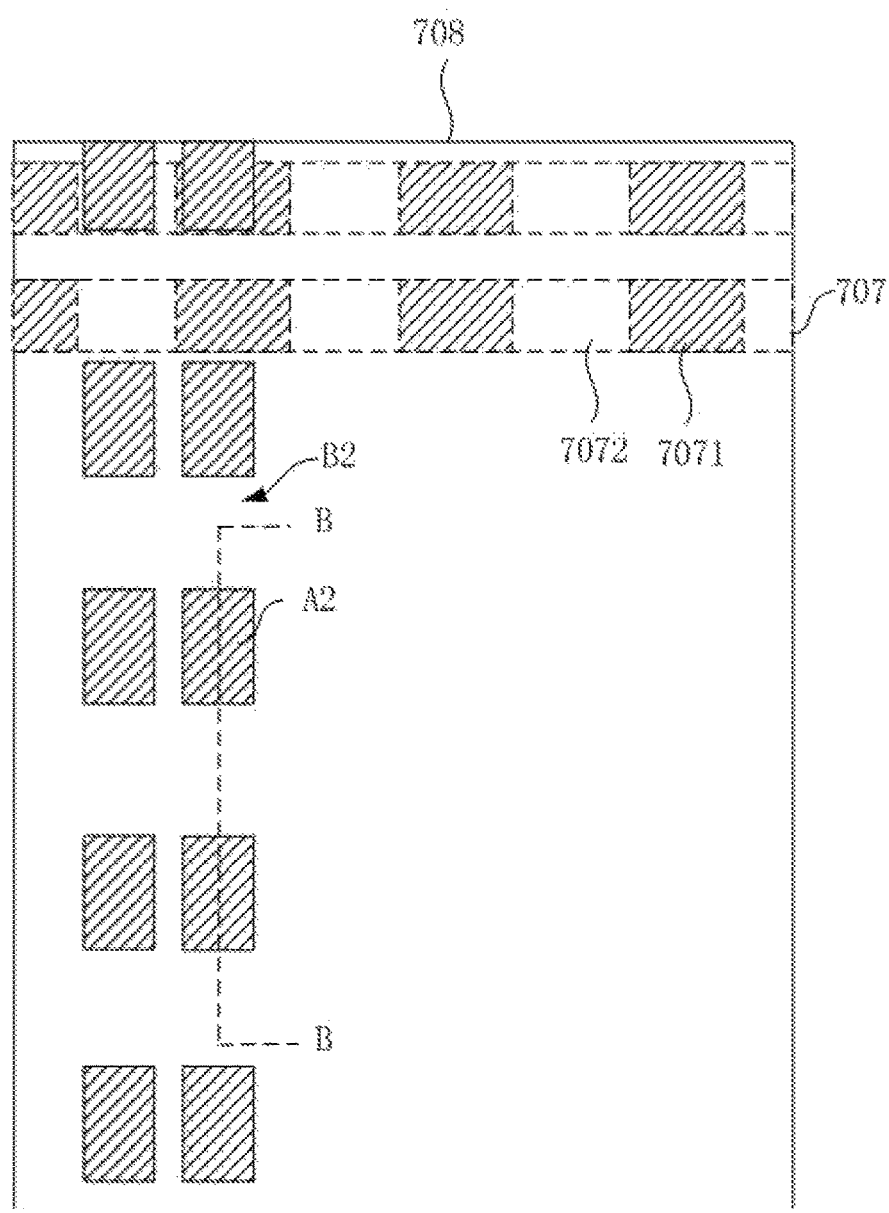
FIG. 7G is a schematic view of a method of manufacturing an array substrate according to the first embodiment of the disclosure.
Figure 7H:
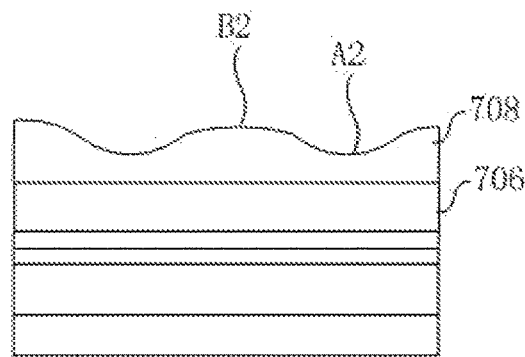
FIG. 7H is a schematic view of a method of manufacturing an array substrate according to the first embodiment of the disclosure.

Referring to FIGS. 7G and 7H, FIG. 7G is a top view, and FIG. 7H is a cross section view along BB line of FIG. 7G. The method of manufacturing the array substrate further includes steps of forming a second electrical insulating layer 708 on the at least one first metal trace 707. The second electrical insulating layer 708 also covers the first electrical insulating layer 706. The second electrical insulating layer 708 includes a plurality of first parts A2 with a first thickness and a plurality of second parts B2 with a second thickness. The first thickness of the first parts A2 of the second electrical insulating layer 708 is less than the second thickness of the second parts B2 of the second electrical insulating layer 708. The first parts A2 and the second parts B2 of the second electrical insulating layer 708 are arranged alternately. A method of forming the second electrical insulating layer 708 having different thicknesses is the same as the method of forming the first electrical insulating layer 706 and will not be described the again. Because the first metal trace 707 is blocked by the second electrical insulating layer 708 in the view angle of FIG. 7G, the first metal trace 707 is illustrated by a dotted line.

In one embodiment of the disclosure, an orthogonal projection of the first part A2 of the second electrical insulating layer 708 on a plane parallel to the substrate is staggered from an orthogonal projection of the first recesses 7071 of the at least one first metal trace 707 on the plane parallel to the substrate. In details, a plurality of queue of an orthogonal projection of the first part A2 of the second electrical insulating layer 708 on a plane parallel to the substrate is staggered from a plurality of queue of an orthogonal projection of the first recesses 7071 of the at least one first metal trace 707 on the plane parallel to the substrate. The first part A2 does not coincide with the first recesses 7071. The method of forming the second electrical insulating layer 708 may be to deposit a flat second electrical insulating layer 708 on the first metal trace 707, and remove a portion of the second electrical insulating layer 708 to form a plurality of first regions A2 having the first thickness and a plurality of second regions B2 having the second thickness.

Figure 7I:
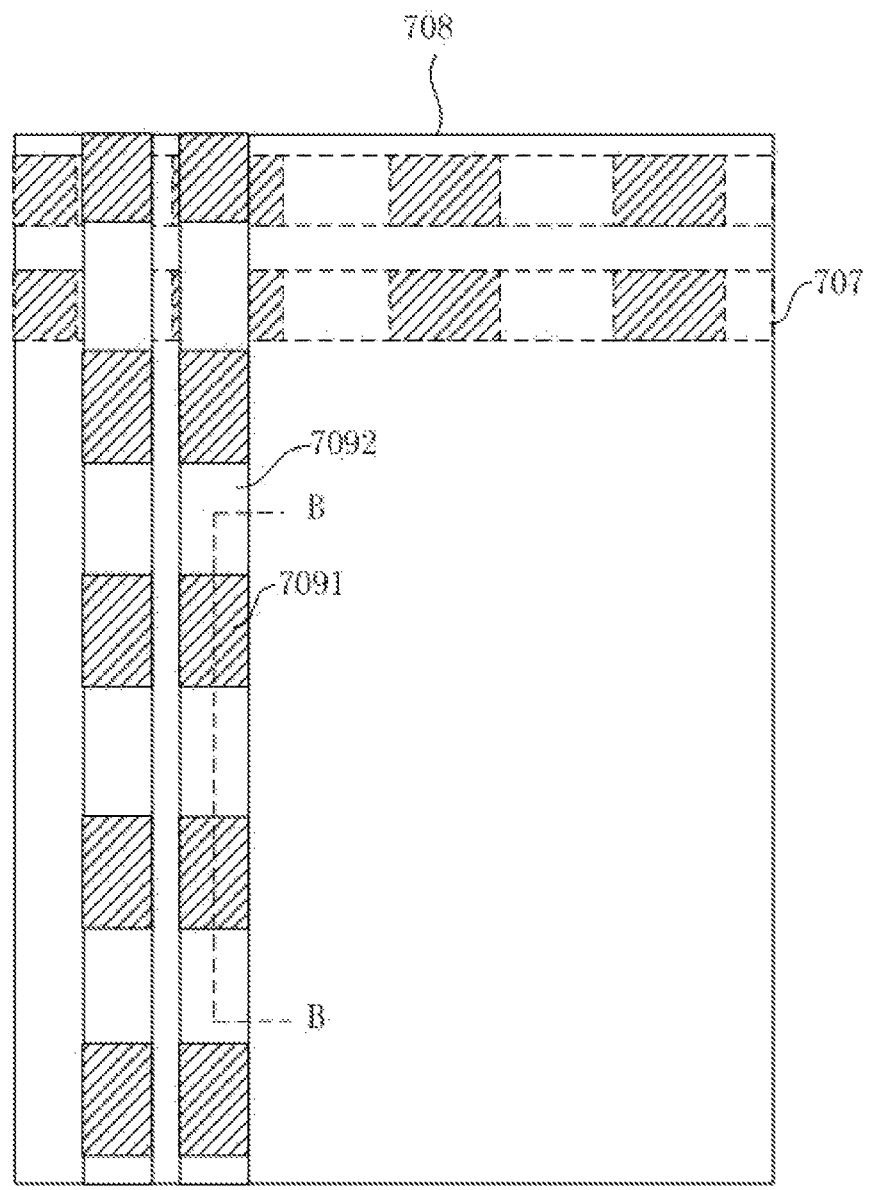
FIG. 7I is a schematic view of a method of manufacturing an array substrate according to the first embodiment of the disclosure.
Figure 7J:
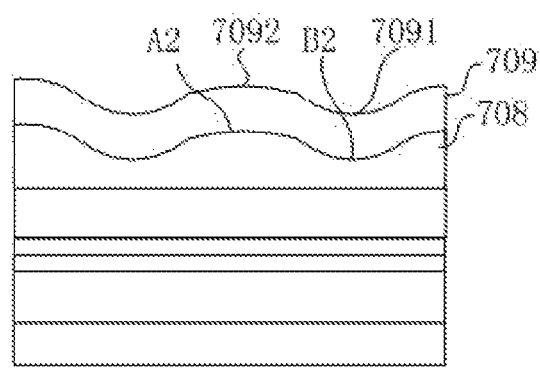
FIG. 7J is a schematic view of a method of manufacturing an array substrate according to the first embodiment of the disclosure.

Referring to FIGS. 7I and 7J, FIG. 7I is a top view, and FIG. 7J is a cross section view along BB line of FIG. 7I. The method of manufacturing the array substrate further includes steps of forming the at least one second metal trace 709 on the second electrical insulating layer 708. The at least one second metal trace 709 forms the second recesses 7091 at the first part A2 of the second electrical insulating layer 708. The at least one second metal trace 709 forms the second protrusions 7092 at the second part B2 of the second electrical insulating layer 708. The second metal trace 709 is formed into a structure having a concavo-convex shape. The method of forming the second metal trace 709 may be to deposit a metal layer on the second electrical insulating layer 708, and pattern the metal layer to form the second metal trace 709. The detail of the method is prior art and will not be described the again.

Figure 7K:
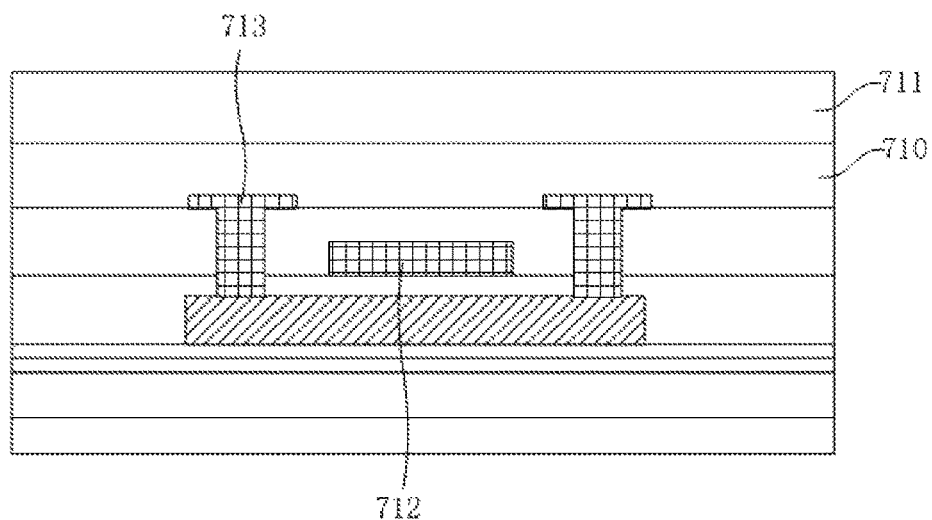
FIG. 7K is a schematic view of a method of manufacturing an array substrate according to the first embodiment of the disclosure.

In this embodiment, the first metal trace 707 is a first gate scan line, which is electrically connected to the gate electrode 712 of the thin film transistor of the array substrate (see FIG. 7K). The second metal trace 709 is a data line which is electrically connected to the source/drain electrode 713 of the thin film transistor of the array substrate (see FIG. 7K). The first metal trace 707 and the second metal trace 709 are both formed into a structure having a concavo-convex shape. The wiring space of the first metal trace 707 and the second metal trace 709 are raised in the longitudinal direction, and the length of the first metal trace 707 and the second metal trace 709 are extended. The first metal trace 707 and the second metal trace 709 are prevented from being broken during the bending process. The reliability of the first metal trace 707 and the second metal trace 709 during the bending and stretching process of the array substrate are improved, and the bending and tensile properties of the array substrate are improved.

Figure 7L:
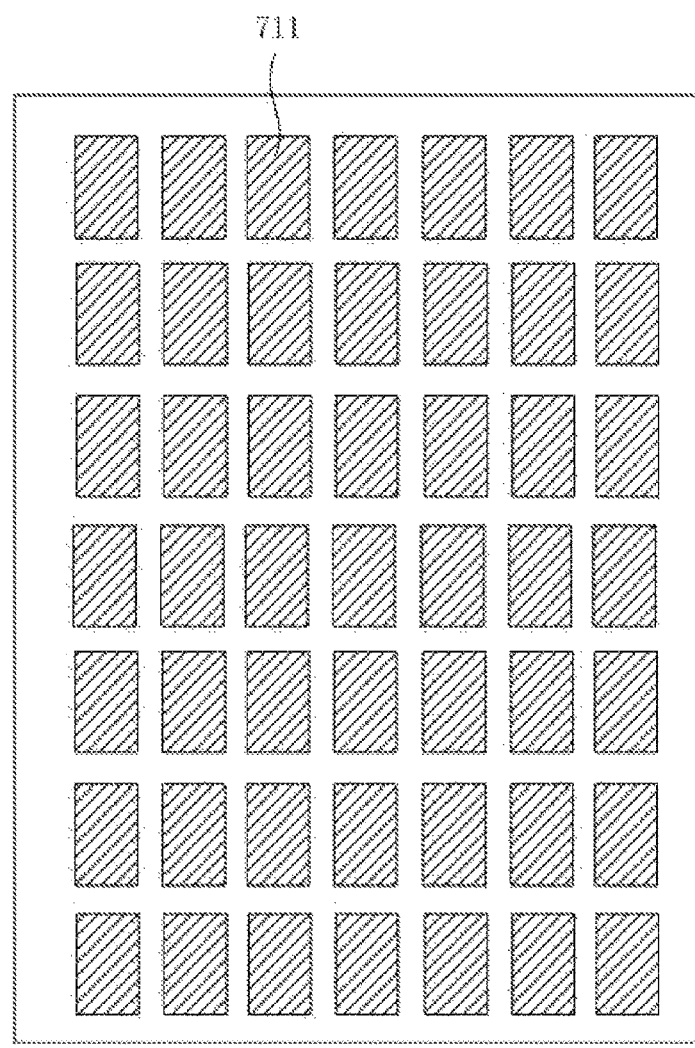
FIG. 7L is a schematic view of a method of manufacturing an array substrate according to the first embodiment of the disclosure.

Referring to FIGS. 7K and 7L, FIG. 7L is a top view, and FIG. 7K is a cross section view. The method of manufacturing the array substrate further includes steps of providing a flatten layer 710 covering the at least one second metal trace 709, and forming an organic light emitting layer 711 on the flatten layer 710. An anode of the organic light emitting layer 711 is electrically connected to a drain electrode of the at least one second metal trace 709. The detail of this step is prior art and will not be described the again.

Figure 8A:
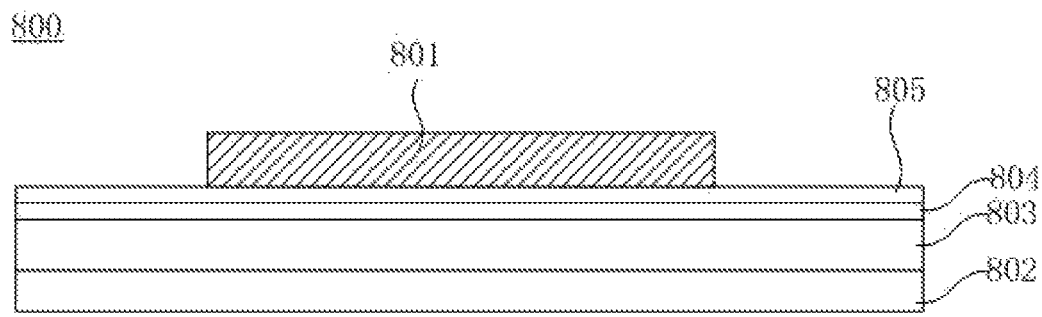
FIG. 8A is a schematic view of a method of manufacturing an array substrate according to the second embodiment of the disclosure.

Furthermore, an embodiment of the disclosure provides another method of manufacturing the array substrate. FIGS. 8A to 8P are a schematic view of a method of manufacturing an array substrate according to the second embodiment of the disclosure.

Figure 8B:
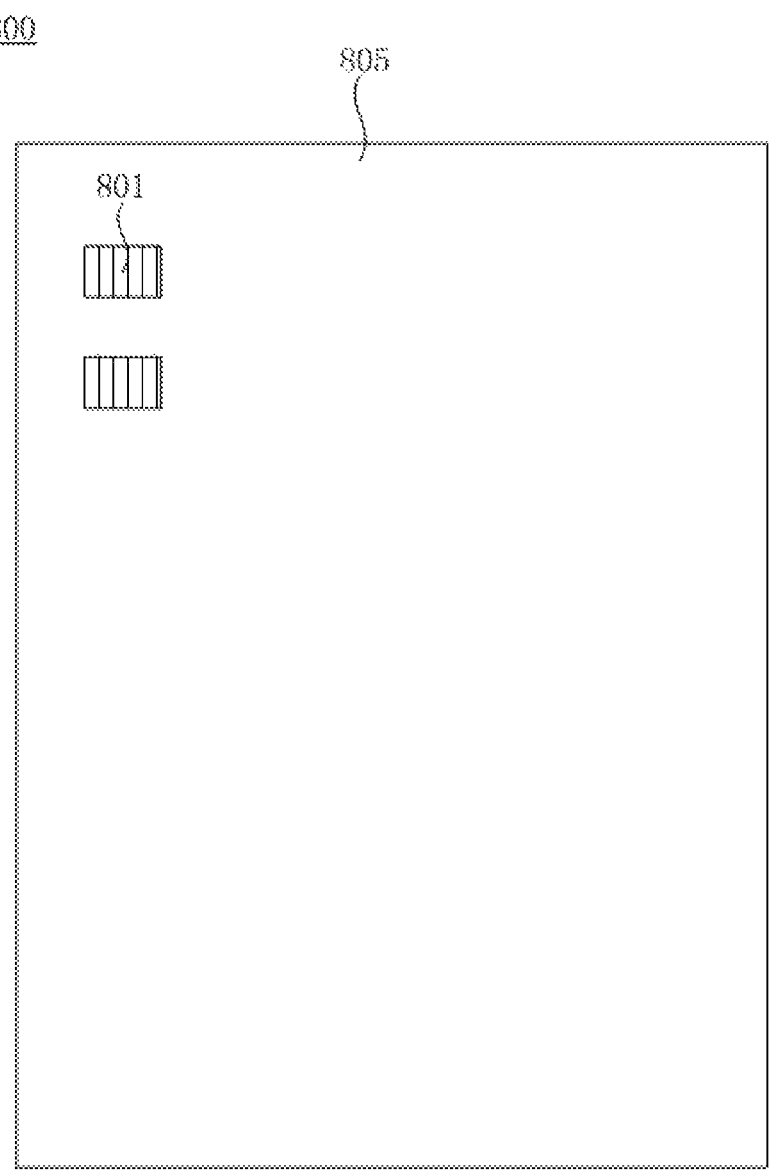
FIG. 8B is a schematic view of a method of manufacturing an array substrate according to the second embodiment of the disclosure.

Referring to FIGS. 8A and 8B, FIG. 8A is a cross section view, and FIG. 8B is a top view. The method of manufacturing the array substrate includes steps of providing a substrate 800, and providing an active layer 801 disposed on a surface of the substrate 800. In details, the substrate 800 further includes a substrate 802, a flexible film layer 803 disposed on the substrate 802, an isolation layer 804 disposed on the flexible film layer 803, and a buffer layer 805. The active layer 801 is disposed on the buffer layer 805. The active layer 801, substrate 802, flexible film layer 803, isolation layer 804, and buffer layer 805 are conventional structures of flexible display panel in the art. For example, in the embodiment, the substrate 802 is a glass substrate. A PI layer is deposited on the glass substrate as a flexible film layer 803. An isolation layer (barrier) 804 is deposited on the flexible film layer 803. The isolation layer 804 is SiNx/SiOx. A buffer layer 805 is deposited on the isolation layer 804. The buffer layer 805 includes, but is not limited to, SiNx/SiOx, and a polysilicon is formed on the buffer layer 805 as an active layer 801.

Figure 8C:
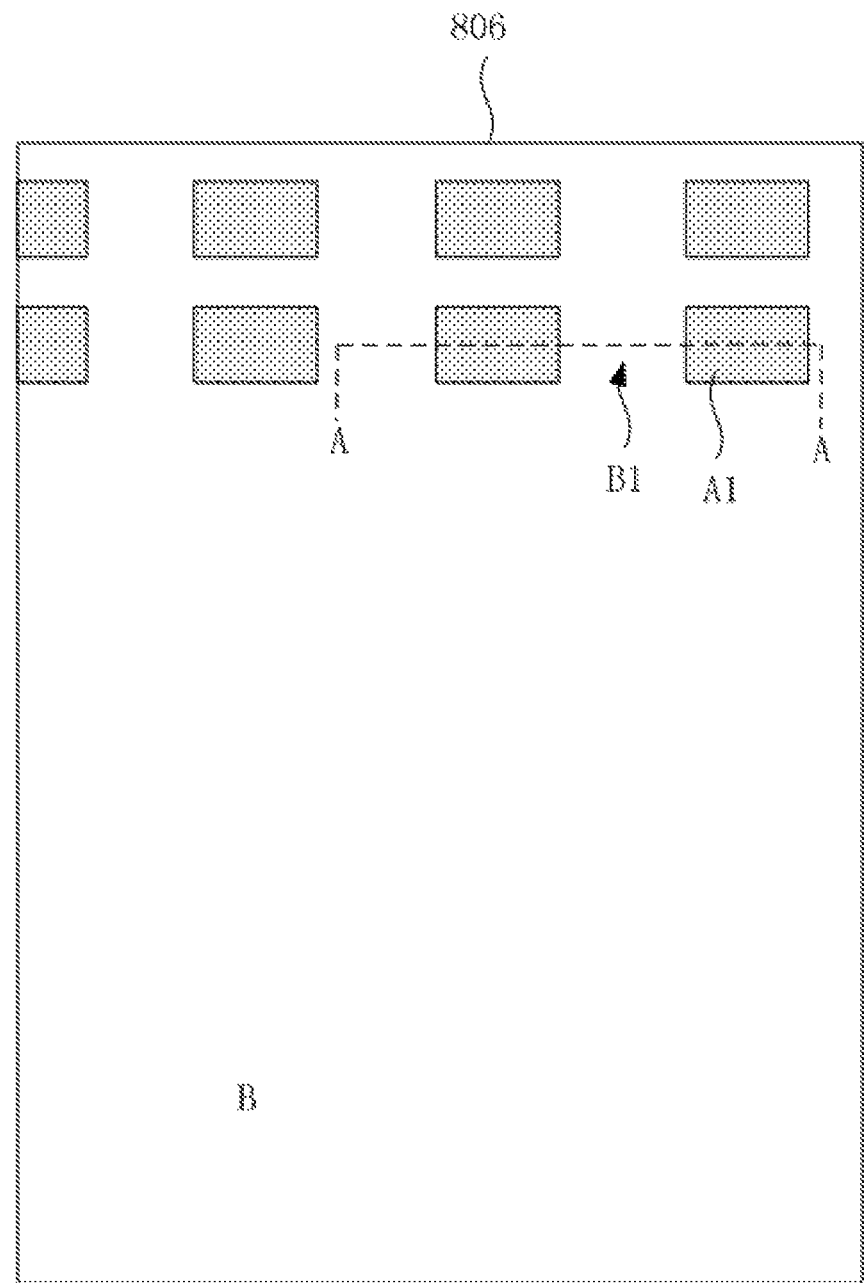
FIG. 8C is a schematic view of a method of manufacturing an array substrate according to the second embodiment of the disclosure.
Figure 8D:
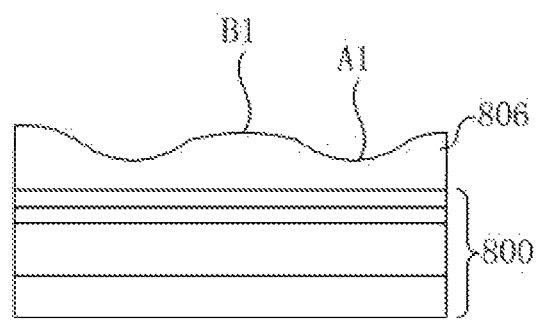
FIG. 8D is a schematic view of a method of manufacturing an array substrate according to the second embodiment of the disclosure.

Referring to FIGS. 8C and 8D, the FIG. 8C is a top view, and the FIG. 8D is a cross section view along AA line of FIG. 8C. The method of manufacturing the array substrate further includes steps of providing a first electrical insulating layer 806 covering a surface of the active layer 801 and the surface of the substrate 800. The first electrical insulating layer 806 includes a plurality of first parts A1 with a first thickness and a plurality of second parts B1 with a second thickness. The first thickness of the first parts A1 of the first electrical insulating layer 806 is less than the second thickness of the second parts B1 of the first electrical insulating layer 806. The first parts A1 of the first electrical insulating layer 806 and the second parts B1 of the first electrical insulating layer 806 are arranged alternately. In order to clearly describe the technical solution of the present disclosure, in FIG. 8C, only a part of the first parts A1 and the second parts B1 are schematically illustrated. The method of forming the first electrical insulating layer 806 having different thicknesses includes, but is not limited to, mask etching or the like. For example, in an embodiment, a method of forming the first insulating layer 806 having different thicknesses is covering with an insulating layer on a surface of the active layer 801 and the surface of the substrate 800, and removing a portion of the first electrical insulating layer 806 by an etching solution to form a plurality of first regions A1 having a first thickness and a plurality of second regions B1 having a second thickness. The etching solution includes, but is not limited to, an HF solution.

Figure 8E:
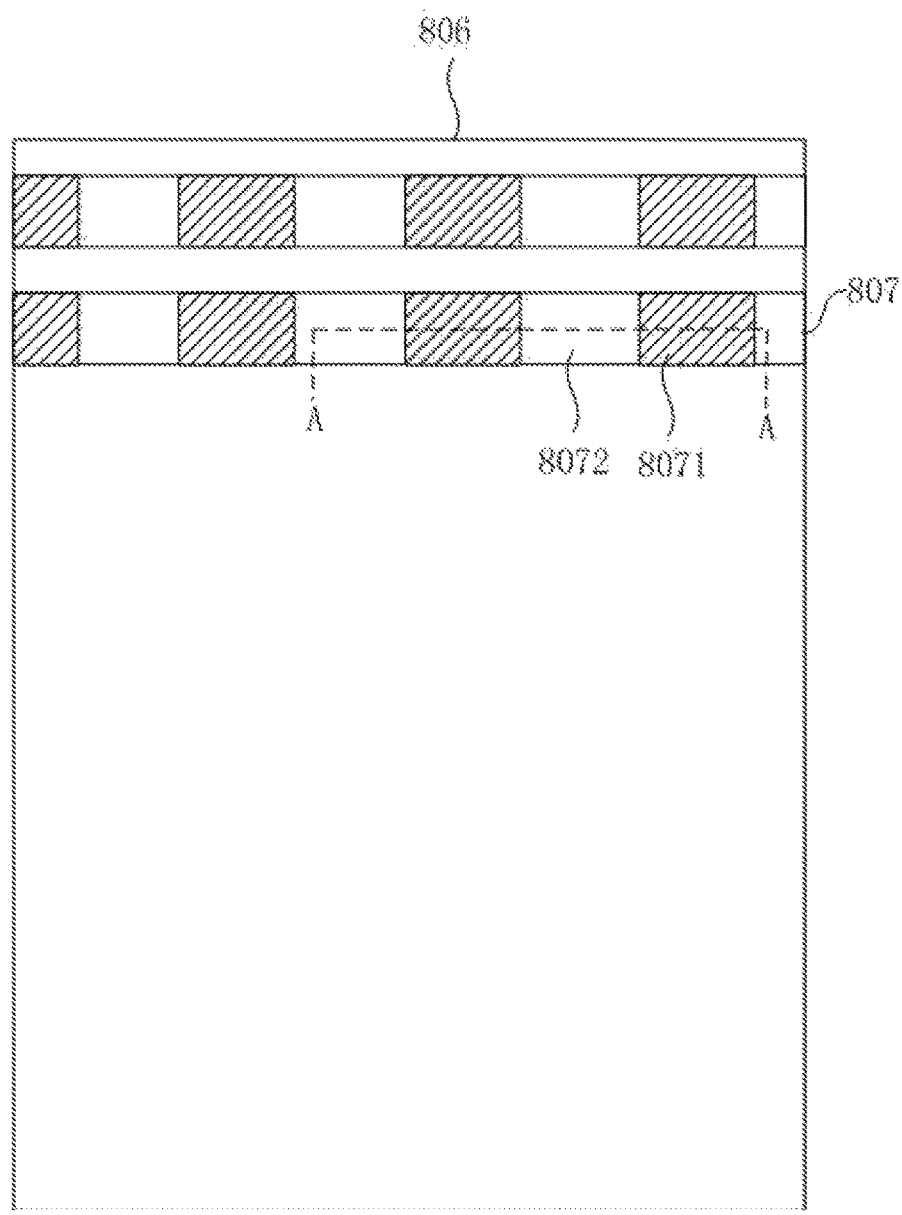
FIG. 8E is a schematic view of a method of manufacturing an array substrate according to the second embodiment of the disclosure.
Figure 8F:
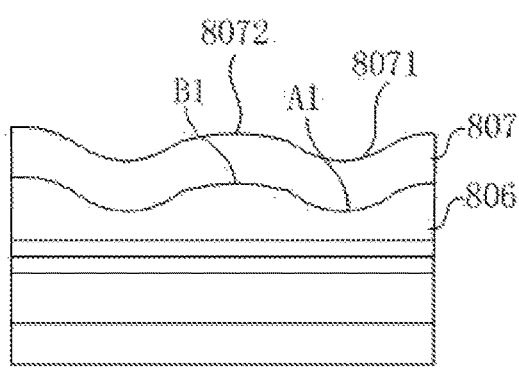
FIG. 8F is a schematic view of a method of manufacturing an array substrate according to the second embodiment of the disclosure.

Referring to FIGS. 8E and 8F, the FIG. 8E is a top view, and FIG. 8F is a cross section view along AA line of FIG. 8E. The method of manufacturing the array substrate further includes steps of forming the at least one first metal trace 807 on the first electrical insulating layer 806, The at least one first metal trace 807 forms the first recesses 8071 at the first part A1 of the first electrical insulating layer 806. The at least one first metal trace 807 forms the first protrusions 8072 at the second part B1 of the first electrical insulating layer 806. The first metal trace 807 is formed into a structure having a concavo-convex shape. The method of forming the first metal trace 807 may be to deposit a metal layer on the first electrical insulating layer 806, and pattern the metal layer to form the first metal trace 807. The detail of the method is prior art and will not be described the again.

Figure 8G:
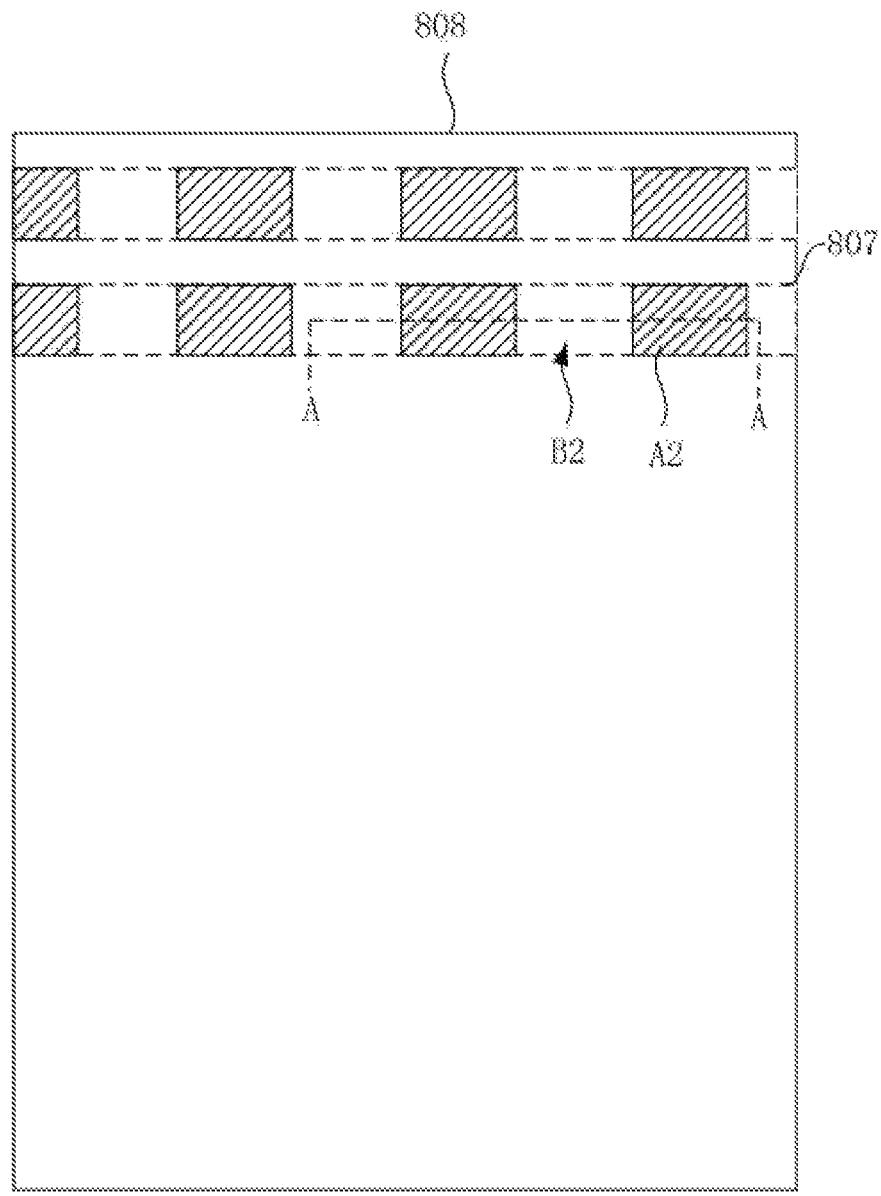
FIG. 8G is a schematic view of a method of manufacturing an array substrate according to the second embodiment of the disclosure.
Figure 8H:
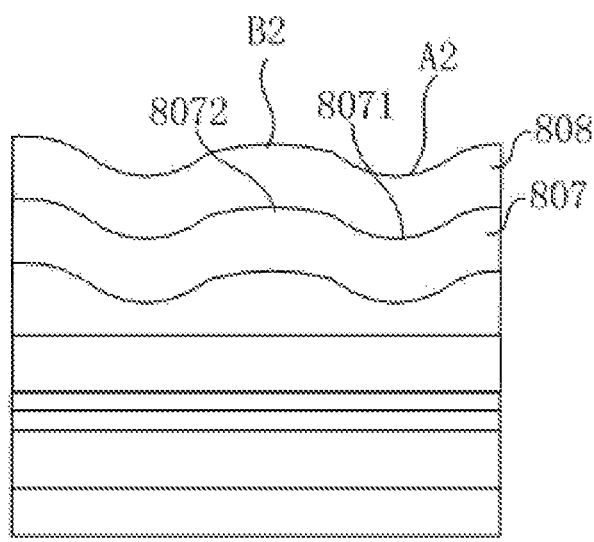
FIG. 8H is a schematic view of a method of manufacturing an array substrate according to the second embodiment of the disclosure.

Referring to FIGS. 8G and 8H, FIG. 8G is a top view, and FIG. 8H is a cross section view along AA line of FIG. 8G The method of manufacturing the array substrate further includes steps of forming a second electrical insulating layer 808 on the at least one first metal trace 807. The second electrical insulating layer 808 also covers the first electrical insulating layer 806. The second electrical insulating layer 808 includes a plurality of first parts A2 with a first thickness and a plurality of second parts B2 with a second thickness. The first thickness of the first parts A2 of the second electrical insulating layer 808 is less than the second thickness of the second parts B2 of the second electrical insulating layer 808. The first parts A2 and the second parts B2 of the second electrical insulating layer 808 are arranged alternately. A method of forming the second electrical insulating layer 808 having different thicknesses is the same as the method of forming the first electrical insulating layer 806 and will not be described the again. Because the first metal trace 807 is blocked by the second electrical insulating layer 808 in the view angle of FIG. 8G the first metal trace 807 is illustrated by a dotted line.

In one embodiment of the disclosure, an orthogonal projection of the first part A2 of the second electrical insulating layer 808 on a plane parallel to the substrate is staggered from an orthogonal projection of the first recesses 8071 of the at least one first metal trace 807 on the plane parallel to the substrate. When depositing the second electrical insulating layer 808 on the first metal trace 807, the plurality of first parts A2 having the first thickness and a plurality of second parts B2 having the second thickness may be directly formed by using the concave and convex shape of the first metal trace 807. Another method of forming the second electrical insulating layer 808 may be to deposit a flat second electrical insulating layer 808 on the first metal trace 807, and remove a portion of the second electrical insulating layer 808 to form a plurality of first regions A2 having the first thickness and a plurality of second regions B2 having the second thickness.

Figure 8I:
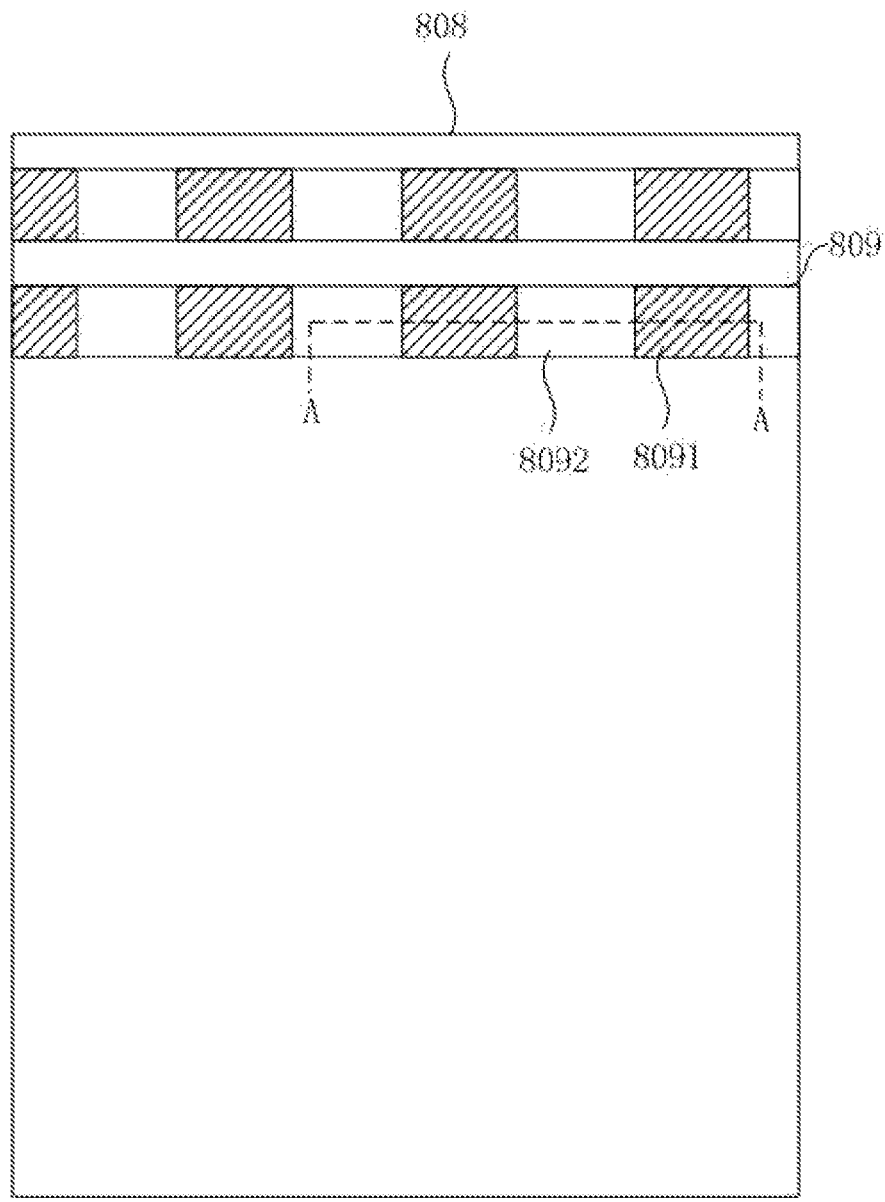
FIG. 8I is a schematic view of a method of manufacturing an array substrate according to the second embodiment of the disclosure.
Figure 8J:
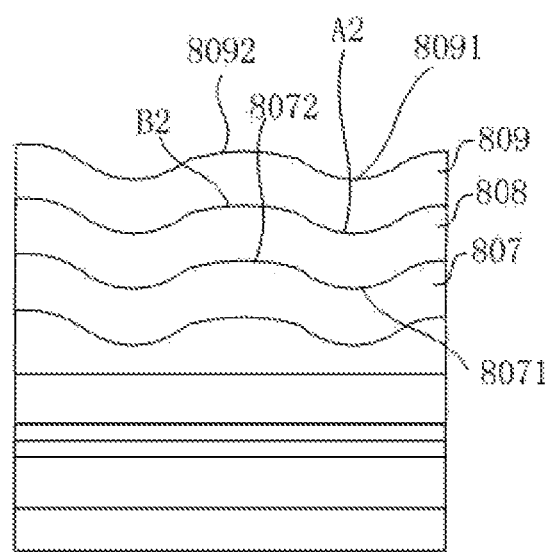
FIG. 8J is a schematic view of a method of manufacturing an array substrate according to the second embodiment of the disclosure.

Referring to FIGS. 8I and 8J, FIG. 8I is a top view, and FIG. 8J is a cross section view along AA line of FIG. 8I. The method of manufacturing the array substrate further includes steps of forming the at least one second metal trace 809 on the second electrical insulating layer 808. The at least one second metal trace 809 forms the second recesses 8091 at the first part A2 of the second electrical insulating layer 808. The at least one second metal trace 809 forms the second protrusions 8092 at the second part B2 of the second electrical insulating layer 808. The second metal trace 809 is formed into a structure having a concavo-convex shape. The method of forming the second metal trace 809 may be to deposit a metal layer on the second electrical insulating layer 808, and pattern the metal layer to form the second metal trace 809. The detail of the method is prior art and will not be described the again.

In this embodiment, the second metal trace 809 is a second gate scan line. An orthogonal projection of the at least one first metal trace 807 on the plane parallel to the array substrate coincides with the orthogonal projection of the at least one second metal trace 809 on the plane parallel to the array substrate. An orthogonal projection of the first recesses 8071 on the plane parallel to the array substrate coincides with an orthogonal projection of the second recesses 8091 on the plane parallel to the array substrate. An orthogonal projection of the first protrusions 8072 on the plane parallel to the array substrate coincides with an orthogonal projection of the second protrusions 8092 on the plane parallel to the array substrate. A storage capacitor is formed between the first metal trace 807 and the second metal trace 809. Because the orthogonal projection of the first recess 8071 coincides with the orthogonal projection of the second recess 8091, and the orthogonal projection of the first protrusion 8072 coincides with the orthogonal projection of the second protrusion 8092, the facing area of the storage capacitor increases. This increases the capacity of the storage capacitor and increases the capacity of the storage capacitor to store charge. The leakage issue occurring in the array substrate during the bending and stretching process is improved, and the uniformity of the display brightness is ensured. The wiring space of the first metal trace 807 and the second metal trace 809 are raised in the longitudinal direction, and the length of the first metal trace 807 and the second metal trace 809 are extended. The first metal trace 807 and the second metal trace 809 are prevented from being broken during the bending process. The reliability of the first metal trace 807 and the second metal trace 809 during the bending and stretching process of the array substrate are improved, and the bending and tensile properties of the array substrate are improved.

Figure 8K:
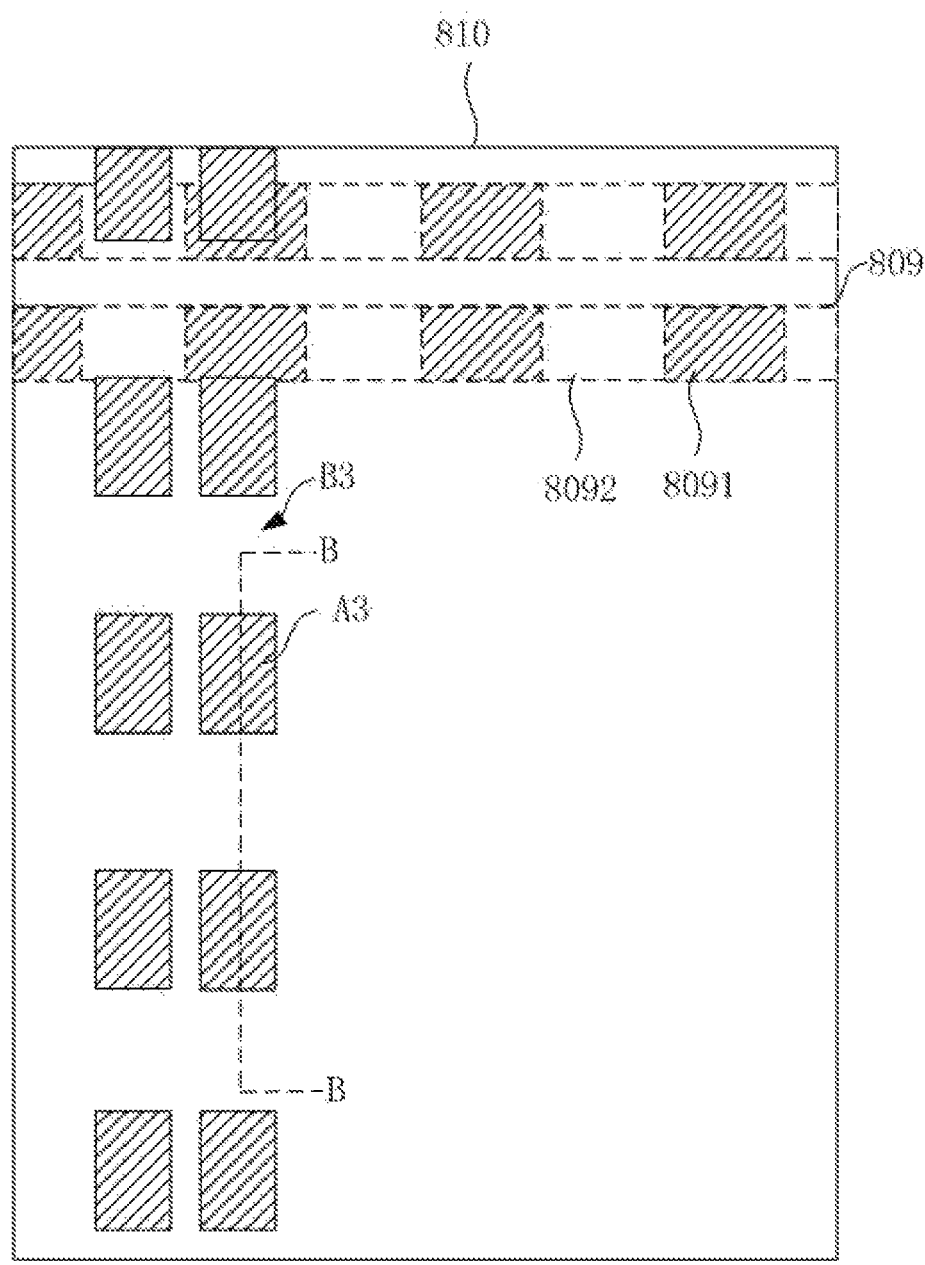
FIG. 8K is a schematic view of a method of manufacturing an array substrate according to the second embodiment of the disclosure.
Figure 8L:
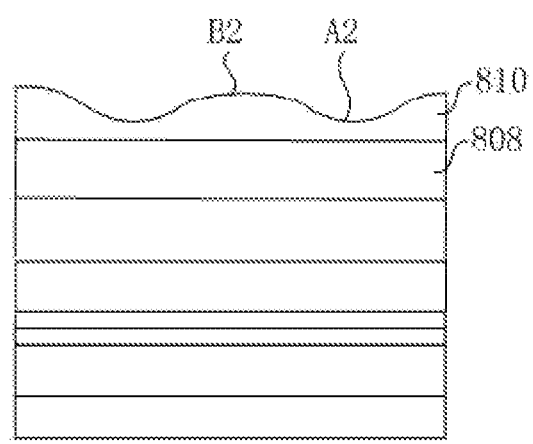
FIG. 8L is a schematic view of a method of manufacturing an array substrate according to the second embodiment of the disclosure.

Referring to FIGS. 8K and 8L, FIG. 8K is a top view, and FIG. 8L is a cross section view along BB line of FIG. 8K. The method of manufacturing the array substrate further includes steps of forming a third electrical insulating layer 810 disposed on the at least one second metal trace 809. The third electrical insulating layer 810 also covers the second electrical insulating layer 808. The third electrical insulating layer 810 includes a plurality of first parts A3 with a first thickness and a plurality of second parts B3 with a second thickness. The first thickness of the first parts A3 is less than the second thickness of the second parts B3. The first parts A3 and the second parts B3 are arranged alternately. A method of forming the third electrical insulating layer 810 having different thicknesses is the same as the method of forming the first electrical insulating layer 806 and will not be described the again. A method of forming the third electrical insulating layer 810 having different thicknesses is the same as the method of forming the second electrical insulating layer 808 and will not be described the again. Because the second metal trace 809 is blocked by the third electrical insulating layer 810 in the view angle of FIG. 8K, the second metal trace 809 is illustrated by a dotted line.

An orthogonal projection of the first part A3 of the third electrical insulating layer 810 on the plane parallel to the substrate is staggered from an orthogonal projection of the first recesses 8091 of the at least one second metal trace 809 on the plane parallel to the substrate. An orthogonal projection of the second part B3 of the third electrical insulating layer 810 on the plane parallel to the substrate is staggered from an orthogonal projection of the first protrusion 8091 of the at least one second metal trace 809 on the plane parallel to the substrate. The first part A3 does not coincide with the first recesses 8091. The second part B3 does not coincide with the first protrusion 8092. The method of forming the third electrical insulating layer 810 may be to deposit a flat third electrical insulating layer 810 on the second metal trace 809, and remove a portion of the third electrical insulating layer 810 to form a plurality of first regions A3 having the first thickness and a plurality of second regions B3 having the second thickness.

Figure 8M:
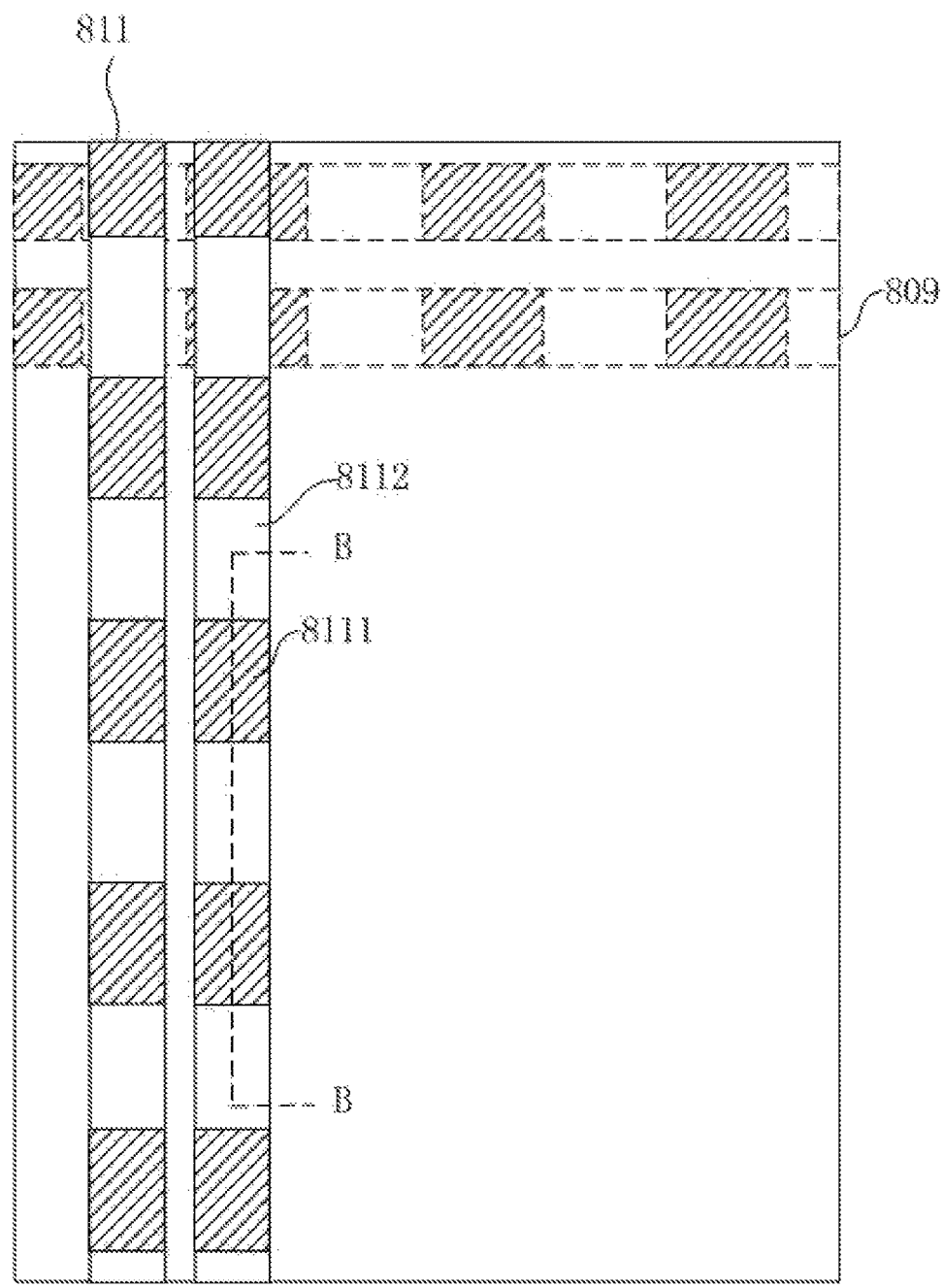
FIG. 8M is a schematic view of a method of manufacturing an array substrate according to the second embodiment of the disclosure.
Figure 8N:
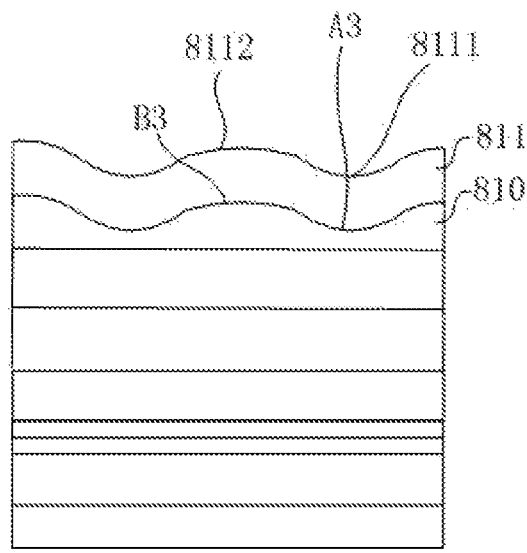
FIG. 8N is a schematic view of a method of manufacturing an array substrate according to the second embodiment of the disclosure.

Referring to FIGS. 8M and 8N, FIG. 8M is a top view, and FIG. 8N is a cross section view along BB line of FIG. 8M. The method of manufacturing the array substrate further includes steps of forming at least one third metal trace 811 on the third electrical insulating layer 810. The at least one third metal trace 811 forms a third recess 8111 at the first part A3 of the third electrical insulating layer 811. The at least one third metal trace 811 forms a third protrusion 8112 at the second part B3 of the third electrical insulating layer 810. The method of forming the third metal trace 811 may be to deposit a metal layer on the third electrical insulating layer 810, and pattern the metal layer to form the third metal trace 811. The detail of the method is prior art and will not be described the again.

Figure 8O:
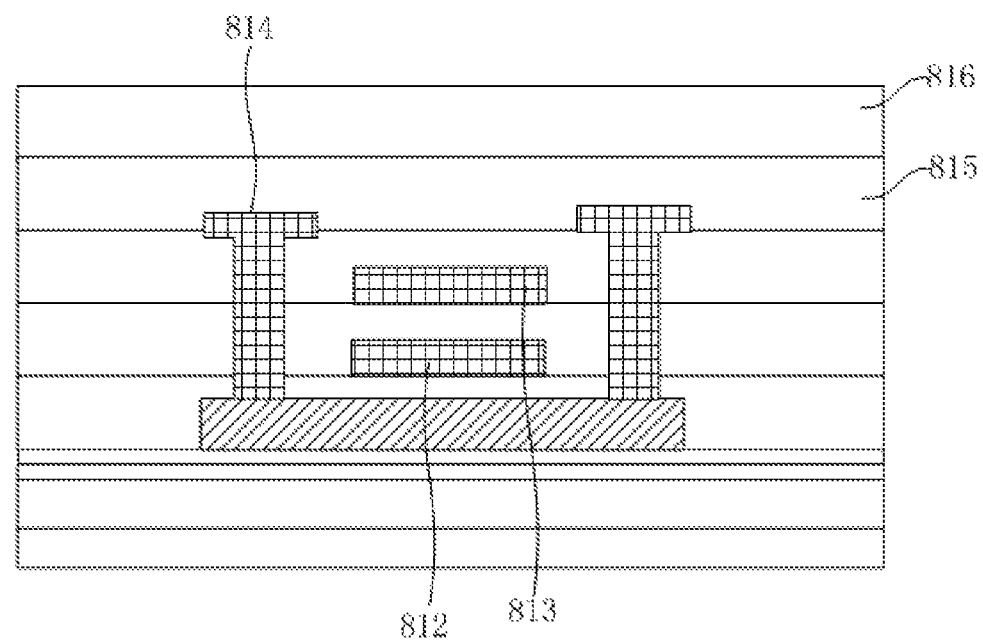
FIG. 8O is a schematic view of a method of manufacturing an array substrate according to the second embodiment of the disclosure.
Figure 8P:
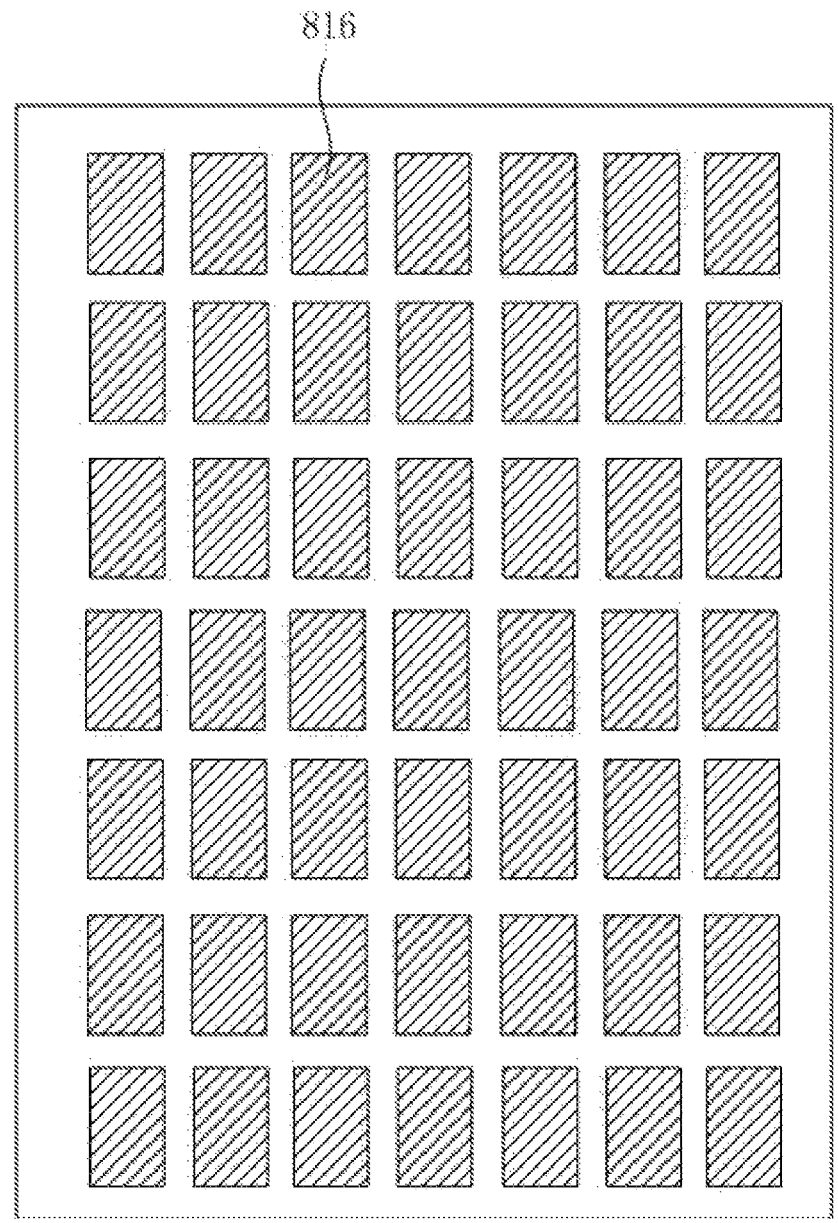
FIG. 8P is a schematic view of a method of manufacturing an array substrate according to the second embodiment of the disclosure.

In this embodiment, the first metal trace 807 is a first gate scan line, which is electrically connected to the first gate electrode 812 of the thin film transistor of the array substrate (see FIG. 8O). The second metal trace 809 is a second gate scan line, which is electrically connected to the second gate electrode 813 of the thin film transistor of the array substrate (see FIG. 8O). The third metal trace 811 is a data line, which is electrically connected to the source/drain electrode 814 of the thin film transistor of the array substrate (see FIG. 8O). The first metal trace 807, the second metal trace 809, and the third metal trace 811 are all formed into a structure having a concavo-convex shape. The wiring space of the first metal trace 807, the second metal trace 809, and the third metal trace 811 are raised in the longitudinal direction, and the length of the first metal trace 807, the second metal trace 809, and the third metal trace 811 are extended. The first metal trace 807, the second metal trace 809, and the third metal trace 811 are prevented from being broken during the bending process. The reliability of the first metal trace 807, the second metal trace 809, and the third metal trace 811 during the bending and stretching process of the array substrate are improved, and the bending and tensile properties of the array substrate are improved. A storage capacitor is formed between the first metal trace 807 and the second metal trace 809. Because the orthogonal projection of the first recess 8071 coincides with the orthogonal projection of the second recess 8091, and the orthogonal projection of the first protrusion 8072 coincides with the orthogonal projection of the second protrusion 8092, the facing area of the storage capacitor increases. This increases the capacity of the storage capacitor and increases the capacity of the storage capacitor to store charge. The leakage issue occurring in the array substrate 100 during the bending and stretching process is improved, and the uniformity of the display brightness is ensured.

Referring to FIGS. 8O and 8P, the method of manufacturing the array substrate further includes steps of providing a flatten layer 815 covering the at least one third metal trace 811, and forming an organic light emitting layer 816 on the flatten layer 815. An anode of the organic light emitting layer 815 is electrically connected to a drain electrode of the at least one third metal trace 811. The detail of this step is prior art and will not be described the again.

Figure 9:
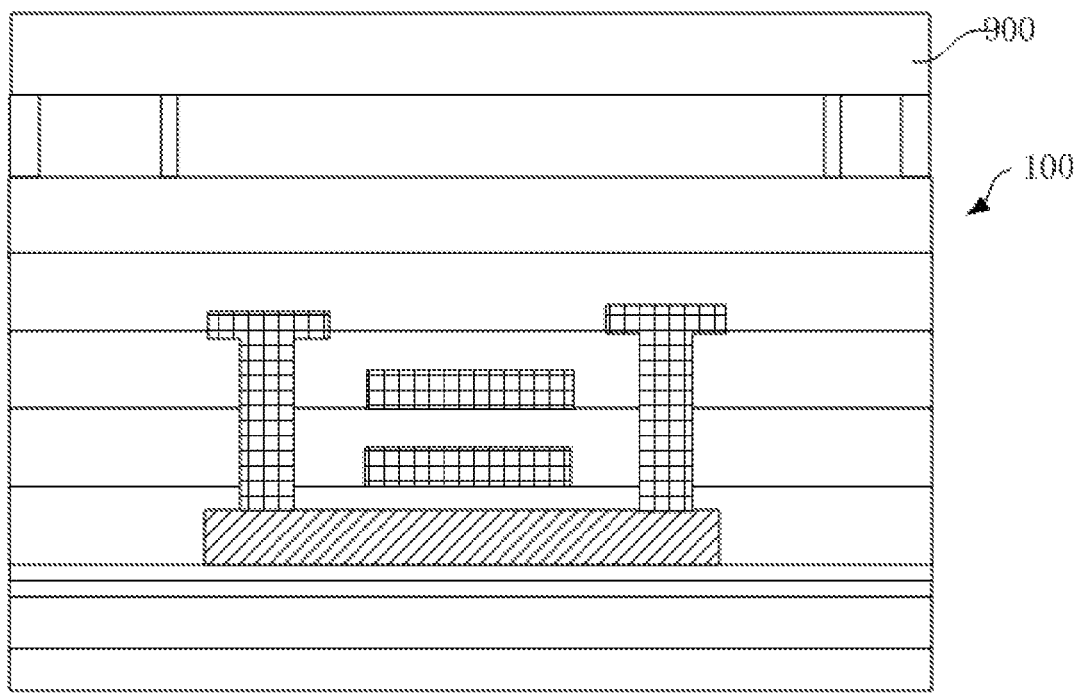
FIG. 9 is a schematic structure view of a display panel according to an embodiment of the disclosure.

Furthermore, another embodiment of the disclosure provides a display panel. FIG. 9 is a schematic structure view of a display panel according to an embodiment of the disclosure. Referring to FIG. 9, the display panel includes an array substrate 100 and a cover plate 900 disposed on the array substrate 100. The cover plate 900 includes, but is not limited to, a cover glass. A structure such as a polarizer (not illustrated in the drawing) may be further disposed between the cover plate 900 and the array substrate 100.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. An array substrate, comprising:
   at least one first metal trace; and
   at least one second metal trace disposed on the at least one first metal trace, wherein the at least one first metal trace is electrically insulated from the at least one second metal trace, the at least one first metal trace comprises a plurality of first recesses and a plurality of first protrusions arranged alternately, and the at least one second metal trace comprises a plurality of second recesses and a plurality of second protrusions arranged alternately;
   wherein an orthogonal projection of the at least one first metal trace on a plane parallel to the array substrate intersects an orthogonal projection of the at least one second metal trace on the plane parallel to the array substrate;
   wherein the array substrate further comprises at least one third metal trace disposed on the at least one first metal trace and under the at least one second metal trace, wherein the at least one third metal trace is electrically insulated from the at least one first metal trace and the at least one second metal trace, the at least one third metal trace comprises a plurality of third recesses and a plurality of third protrusions arranged alternately, an orthogonal projection of the at least one third metal trace on the plane parallel to the array substrate coincides with the orthogonal projection of the at least one first metal trace on the plane parallel to the array substrate, an orthogonal projection of the third recesses on the plane parallel to the array substrate coincides with an orthogonal projection of the first recesses on the plane parallel to the array substrate, and an orthogonal projection of the third protrusions on the plane parallel to the array substrate coincides with an orthogonal projection of the first protrusions on the plane parallel to the array substrate.

2. The array substrate according to claim 1, wherein the at least one first metal trace is a first gate scan line, the at least one second metal trace is a data line, and the at least one third metal trace is a second gate scan line.

3. A method of manufacturing the array substrate according to claim 1, comprising steps of:
   providing a substrate;
   providing an active layer disposed on a surface of the substrate;
   providing a first electrical insulating layer covering a surface of the active layer and the surface of the substrate, wherein the first electrical insulating layer comprises a plurality of first parts with a first thickness and a plurality of second parts with a second thickness, the first thickness of the first parts of the first electrical insulating layer is less than the second thickness of the second parts of the first electrical insulating layer, and the first parts and the second parts of the first electrical insulating layer are arranged alternately;

forming the at least one first metal trace on the first electrical insulating layer, wherein the at least one first metal trace forms the first recesses at the first part of the first electrical insulating layer, and the at least one first metal trace forms the first protrusions at the second part of the first electrical insulating layer;

forming a second electrical insulating layer on the at least one first metal trace, wherein the second electrical insulating layer comprises a plurality of first parts with a first thickness and a plurality of second parts with a second thickness, the first thickness of the first parts of the second electrical insulating layer is less than the second thickness of the second parts of the second electrical insulating layer, and the first parts and the second parts of the second electrical insulating layer are arranged alternately; and forming the at least one second metal trace on the second electrical insulating layer, wherein the at least one second metal trace forms the second recesses at the first part of the second electrical insulating layer, and the at least one second metal trace forms the second protrusions at the second part of the second electrical insulating layer.

4. The method according to claim 3, wherein an orthogonal projection of the first part of the second electrical insulating layer on a plane parallel to the substrate is staggered from an orthogonal projection of the first recesses of the at least one first metal trace on the plane parallel to the substrate.

5. The method according to claim 3, wherein an orthogonal projection of the first part of the second electrical insulating layer on a plane parallel to the substrate coincides with an orthogonal projection of the first recesses of the at least one first metal trace on the plane parallel to the substrate.

6. The method according to claim 5, wherein after the step of forming the second metal trace on the second electrical insulating layer, the method further comprises:

forming a third electrical insulating layer disposed on the at least one second metal trace, wherein the third electrical insulating layer comprises a plurality of first parts with a first thickness and a plurality of second parts with a second thickness, the first thickness of the first parts of the third electrical insulating layer is less than the second thickness of the second parts of the third electrical insulating layer, the first parts and the second parts of the third electrical insulating layer are arranged alternately, and an orthogonal projection of the first part of the third electrical insulating layer on the plane parallel to the substrate is staggered from an orthogonal projection of the first recesses of the at least one second metal trace on the plane parallel to the substrate; and forming at least one third metal trace on the third electrical insulating layer, wherein the at least one third metal trace forms a third recess at the first part of the third electrical insulating layer, and the at least one third metal trace forms a third protrusion at the second part of the third electrical insulating layer.

7. The method according to claim 3, further comprising steps of:

providing a flatten layer covering the at least one second metal trace; and forming an organic light emitting layer on the flatten layer, wherein an anode of the organic light emitting layer is electrically connected to a drain electrode of the at least one second metal trace.

8. An array substrate, comprising:

at least one first metal trace; and at least one second metal trace disposed on the at least one first metal trace, wherein the at least one first metal trace is electrically insulated from the at least one second metal trace, the at least one first metal trace comprises a plurality of first recesses and a plurality of first protrusions arranged alternately, and the at least one second metal trace comprises a plurality of second recesses and a plurality of second protrusions arranged alternately;

wherein an orthogonal projection of the at least one first metal trace on a plane parallel to the array substrate coincides with an orthogonal projection of the at least one second metal trace on the plane parallel to the array substrate, an orthogonal projection of the first recesses on the plane parallel to the array substrate coincides with an orthogonal projection of the second recesses on the plane parallel to the array substrate, and an orthogonal projection of the first protrusions on the plane parallel to the array substrate coincides with an orthogonal projection of the second protrusions on the plane parallel to the array substrate;

wherein the at least one first metal trace is a first gate scan line, and the at least one second metal trace is a second gate scan line.

* * * * *